US009123832B2

(12) United States Patent
Yeo et al.

(10) Patent No.: US 9,123,832 B2
(45) Date of Patent: Sep. 1, 2015

(54) FABRICATING METHOD OF NANO STRUCTURE FOR ANTIREFLECTION AND FABRICATING METHOD OF PHOTO DEVICE INTEGRATED WITH ANTIREFLECTION NANO STRUCTURE

(75) Inventors: Chan Il Yeo, Gwangju (KR); Yong Tak Lee, Gwangju (KR); Young Min Song, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 0 days.

(21) Appl. No.: 13/702,172

(22) PCT Filed: Nov. 30, 2010

(86) PCT No.: PCT/KR2010/008510
§ 371 (c)(1),
(2), (4) Date: Dec. 5, 2012

(87) PCT Pub. No.: WO2012/018163
PCT Pub. Date: Feb. 9, 2012

(65) Prior Publication Data
US 2013/0078750 A1 Mar. 28, 2013

(30) Foreign Application Priority Data
Aug. 2, 2010 (KR) .................. 10-2010-0074565

(51) Int. Cl.
*H01L 21/00* (2006.01)
*H01L 33/00* (2010.01)
(Continued)

(52) U.S. Cl.
CPC .......... *H01L 33/005* (2013.01); *B81C 1/00031* (2013.01); *H01L 33/22* (2013.01)

(58) Field of Classification Search
CPC .... B81C 1/00031; H01L 33/005; H01L 33/22
See application file for complete search history.

(56) References Cited

U.S. PATENT DOCUMENTS 5,244,731 A * 9/1993 Saito et al. ..................... 428/372
6,184,125 B1 * 2/2001 Chigusa et al. ............... 438/636
(Continued)

FOREIGN PATENT DOCUMENTS

CN 1968822 A 5/2007
CN 101507095 A 8/2009
(Continued)

OTHER PUBLICATIONS

Seong-Je Park et al., An Antireflective Nanostructure Array Fabricated by Nanosilver Colloidal Lithography on a Silicon Substrate, Nanoscale Res Lett (2010) 5:1570-1577.*
(Continued)

*Primary Examiner* — Reema Patel
*Assistant Examiner* — Syed Gheyas
(74) *Attorney, Agent, or Firm* — Nath, Goldberg & Meyer; Joshua B. Goldberg; Scott H. Blackman

(57) ABSTRACT

A method of fabricating nanostructure for antireflection and a method of fabricating a photo device integrated with the nanostructure for antireflection are provided. The fabrication of the nanostructure for antireflection includes coating a solution containing a combination of metal ions with organic or inorganic ions on a substrate, sintering the coated solution using an annealing process to grow nanoscale metal particles, and chemically etching the substrate using the metal particles as mask or accelerator to form a subwavelength nanostructure on the surface of the substrate, thereby manufacturing the nanostructure for antireflection without an apparatus requiring a vacuum state using a simple method for a short amount of time to minimize reflection of light at an interface between a semiconductor material and the air, and producing a photo device having good luminous efficiency and performance at low cost in large quantities by applying it to the photo device.

17 Claims, 18 Drawing Sheets

(51) Int. Cl.
 *B81C 1/00* (2006.01)
 *H01L 33/22* (2010.01)

(56) References Cited

U.S. PATENT DOCUMENTS

| | | | |
|---|---|---|---|
| 7,893,448 B2* | 2/2011 | Kim | 257/95 |
| 2005/0101153 A1 | 5/2005 | Matsumura et al. | |
| 2005/0276911 A1* | 12/2005 | Chen et al. | 427/96.1 |
| 2006/0162557 A1* | 7/2006 | Kim et al. | 95/135 |
| 2006/0270074 A1 | 11/2006 | Kim | |
| 2009/0117683 A1* | 5/2009 | Kang | 438/72 |
| 2011/0024793 A1* | 2/2011 | Jeon | 257/184 |

FOREIGN PATENT DOCUMENTS

| | | |
|---|---|---|
| CN | 101656284 A | 2/2010 |
| KR | 20090104304 A | 10/2009 |
| WO | WO 2010093069 A1 * | 8/2010 |
| WO | WO 2011152973 A1 * | 12/2011 |

OTHER PUBLICATIONS

Chinese Patent Application No. 201080068388.9, Office Action dated Dec. 18, 2014, twenty-one (21) pages.

* cited by examiner (b)

(a)

(a)  (b)

(c)

(a)

(b)

(c)

(d)

US 9,123,832 B2

FABRICATING METHOD OF NANO STRUCTURE FOR ANTIREFLECTION AND FABRICATING METHOD OF PHOTO DEVICE INTEGRATED WITH ANTIREFLECTION NANO STRUCTURE

This is a National Phase Application filed under 35 U.S.C. 371 as a national stage of PCT/KR2010/008510, filed Nov. 30, 2010, and claims priority from Korean Application No. 10-2010-0074565, filed Aug. 2, 2010, the content of each of which is hereby incorporated by reference in its entirety.

TECHNICAL FIELD

The present invention relates to a method of fabricating a nanostructure for anti-reflection and a method of fabricating a photo device integrated with an anti-reflection nanostructure, and more particularly, to a method of fabricating a nanostructure for anti-reflection, which includes coating a solution containing a combination of metal ions with organic or inorganic ions on a substrate, sintering the coated solution using an annealing process to grow nanoscale metal particles, chemically etching the substrate using the sintered nanoscale metal particles so that a subwavelength nanostructure for antireflection may be formed on the semiconductor substrate for a short amount of process time using a simple method without an apparatus requiring a vacuum state. Thus, the nanostructure for antireflection may minimize reflection of light at an interface between a semiconductor material and the air. Also, the nanostructure for anti-reflection may be integrated with a photo device so that the photo device having good luminous efficiency and performance can be produced in large quantities at low cost.

BACKGROUND ART

In general, according to Fresnel s law by which reflection of light emitted at an interface between materials with different refractive indices increases with an increase in the difference between the refractive indices, reflection of light emitted at the interface due to a difference in refractive index between a photo device including a material with a high refractive index and the air may be directly related with the performance of the photo device, and minimizing reflection of light may be necessary to fabricate a photo device with good performance. Accordingly, development of a technique for minimizing reflection of light emitted between the photo device and the air using a simple method for a short amount of time at low cost has progressed.

For example, in order to reduce reflection of light in photo devices, such as solar cells, photodetectors, emitting diodes, and transparent glasses to improve the luminous efficiency and performance of the photo devices, an anti-reflective coating (ARC) method and a surface texturing method have typically been used as anti-reflection methods.

The ARC method includes depositing a material having a lower refractive index than a semiconductor material on the semiconductor material to reduce a sharp difference in refractive index between the semiconductor material and the air and lessen reflection of light. In this case, a single or multiple anti-reflective layer may be deposited.

Although the refractive index and optical thickness of a coating material may be controlled using the ARC method to minimize a reflectance in a specific wavelength range, selection of a coating material used as an anti-reflective layer is limited according to the type of a semiconductor material. Also, a reflectance and a wavelength range may depend on the electrical and thermal properties of the coating material. Furthermore, it is difficult to reduce the reflectance over a wide wavelength range and a wide incident angle.

The surface texturing method includes forming a regular or irregular structure or bend on the surface of a semiconductor material using a physical etching process or chemical etching process to reduce reflection of light on the surface of the semiconductor material.

The physical etching process used for the surface texturing method may be, for example, a plasma etching process, a photolithography process, or a mechanical scribing process. Although these processes do not cause disparity in etch rate according to a crystallization direction of a semiconductor substrate and enable a reduction in reflectance, the processes are complicated, take long amounts of time, preclude mass production, and require high-priced vacuum apparatuses and additional equipment. Accordingly, the above-described physical etching processes may be commercially inaccessible.

By comparison, in the chemical etching process used for the surface texturing method, a surface shape and etch rate may be varied according to the crystallization direction of the semiconductor substrate, the type of a component, a composition ratio, and a doping type and forming a fine structure may be difficult. However, as compared with the physical etching process, the chemical etching process may require simpler process steps and shorter process times, enable low-cost mass production of photo devices, and facilitate process control, so the chemical etching process has been under study for the purpose of texturing a semiconductor surface.

In recent years, a vast amount of research has been conducted on a method of fabricating a subwavelength structure (SWS), which overcomes the restrictions of the ARC method, obtains a much lower reflectance in a wider wavelength range than a surface texturing method, and exhibits a low reflectance over a wide range of incident angles.

Conventionally, fabrication of an SWS may include forming a subwavelength periodic or non-periodic pattern on a substrate using an electronic beam (e-beam) lithography process or hologram lithography process and performing a physical etching process or chemical etching process using the subwavelength periodic or non-periodic pattern. Alternatively, the fabrication of the SWS may be performed using a nano-imprint process and a lift-off process. However, these conventional methods are uneconomical due to complicated process steps, low productivity, and long process times.

Accordingly, it is absolutely necessary to develop techniques of integrating a photo device with a subwavelength nanostructure for antireflection with high luminous efficiency using a chemical etching process and produce devices with good luminous efficiency and performance in large quantities using simple processes, short process times, low fabrication costs, and easy process control.

DISCLOSURE OF INVENTION

Technical Problem

To solve the above-described problems, the present invention provides a method of fabricating a nanostructure for antireflection. The method includes coating a solution containing a combination of metal ions with organic or inorganic ions on a substrate, sintering the coated solution using an annealing process to grow nanoscale metal particles, and chemically etching the substrate using the sintered nanoscale metal particles. Thus, a subwavelength nanostructure for antireflection may be formed on the semiconductor substrate for a short amount of process time using a simple method without an apparatus requiring a vacuum state. Also, the nanostructure for anti-reflection may minimize reflection of light at an interface between a semiconductor material and the air. Furthermore, the nanostructure for antireflection may be integrated with a photo device so that the photo device having good luminous efficiency and performance can be produced in large quantities at low cost.

The present invention also provides a method of fabricating a nanostructure for anti-reflection and a method of fabricating a photo device integrated with a nanostructure for antireflection. As compared with the above-mentioned conventional methods, even if there is a step difference or a structure, such as an electrode, on a semiconductor substrate, a subwavelength nanostructure may be fabricated on the semiconductor substrate using a simple process without an apparatus requiring a vacuum state for a short process time at low cost. That is, the method includes coating a solution containing a combination of metal ions with organic or inorganic ions on the semiconductor substrate except the step difference or structure or a specific portion of the semiconductor substrate to form subwavelength nanoscale metal particles and fabricating a nanostructure for antireflection on a wafer scale using a chemical etching process.

Solution to Problem

According to an exemplary embodiment, a method of fabricating a nanostructure for antireflection includes: coating a solution containing a combination of metal ions with organic or inorganic ions on a substrate; sintering the coated solution using an annealing process to grow nanoscale metal particles; and chemically etching the substrate using the metal particles as a mask or accelerator to form the subwavelength nanostructure on the substrate.

According to another exemplary embodiment, a method of fabricating a nanostructure for antireflection includes: depositing a transparent electrode or buffer layer on a substrate; coating a solution containing a combination of metal ions with organic or inorganic ions on the transparent electrode or the buffer layer; sintering the coated solution using an annealing process to grow nanoscale metal particles; performing a chemical etching process using the metal particles as a mask or accelerator such that the transparent electrode or the buffer layer becomes a nanostructure transparent electrode or buffer layer; and chemically etching the substrate using the nanostructure transparent electrode or buffer layer and the metal particles to form the subwavelength nanostructure on the substrate.

The metal ions may be any metal ion capable of being bonded to the organic ions to build a polymer chain or being ionically bonded to monatomic or polyatomic inorganic ions.

The solution obtained by bonding the metal ions to the organic ions may be diluted with one alcohol-based solution selected from the group consisting of methanol, ethanol, and isopropyl alcohol to adjust the concentration of a metal. Thus, a coated thickness of the solution and the size of the metal particles obtained after the sintering process may be controlled by adjusting the concentration of the metal.

The solution obtained by bonding the metal ions with the monatomic or polyatomic inorganic ions may be diluted with water ($H_2O$) or another solution to adjust the concentration of a metal in the solution. Thus, the coated thickness of the solution and the size of the metal particles obtained after the sintering process may be controlled by adjusting the concentration of the metal.

The solution may be simply coated using any one selected from the group consisting of a spin coating process, a dip coating process, a spray coating process, and a roll-to-roll coating process.

In addition to the above-mentioned methods of adjusting the concentration of the metal in the solution, the coated thickness of the solution may be adjusted using a coating apparatus and coating conditions of the apparatus. The solution may be coated to a thickness of about 1 to 500 nm.

The coated thickness of the solution, the concentration of the metal in the solution, an annealing temperature, and an annealing time may affect the thickness of the metal particles obtained after the sintering process. As the coated thickness of the solution, the concentration of the metal, and the annealing temperature and time increase, the thickness of the metal particles obtained after the sintering process may increase. Also, as the thickness of the metal particles increases, the semiconductor substrate may be etched to a greater depth.

The size and shape of the metal particles may be controlled using the above-described method of adjusting the coated thickness of the solution. The metal particles may have a size with a subwavelength period.

The annealing of the coated solution may be performed using any sintering apparatus, such as a hot plate, an oven, a rapid thermal annealing (RTA) apparatus.

The annealing of the coated solution may be performed in a nitrogen ($N_2$) atmosphere to prevent oxidation of the metal ions and improve reproducibility and reliability with respect to the size and thickness of the metal particles after sintering.

A buffer layer may be deposited on the semiconductor substrate to improve adhesion of the solution and increase inter-metal bonding during the sintering process so that the nanostructure can have stable sintering properties irrespective of the semiconductor substrate.

The formation of the subwavelength metal particles may include breaking down a polymer-chain bond between the metal ions and the organic ions using an annealing process or breaking down an ionic bond between the metal ions and the inorganic ions to unite metals. In this case, sufficient temperature and time may be selected to break down the polymer-chain bond or ionic bond.

During a chemical etching process required for fabricating the subwavelength nanostructure for antireflection, the metal particles obtained using the sintering process may be used as a mask configured to prevent reaction of a portion containing the metal particles or an accelerator configured to accelerate chemical etching of the portion containing the metal particles.

The type and amount of a chemical material used for the chemical etching may be selected according to the type of a metal having chemical activation energy, the type of a semiconductor material, and the function of the metal particles as a mask or accelerator.

When the metal particles function as the accelerator during the chemical etching process, the types and mixture of chemical materials may be controlled not to etch the semiconductor material in a metal-free state or to etch the semiconductor material at a very low rate.

When the metal particles function as the accelerator during the chemical etching process, at least two kinds of chemical materials may be employed. Thus, some of the chemical materials may be used to oxidize the semiconductor material, while the remaining chemical materials may be used to remove the oxidized semiconductor material. Therefore, the at least two kinds of chemical materials may be a combination of chemical materials having different functions to etch the semiconductor material.

During the chemical etching process, the shape, etch rate, etching directionality, surface roughness, and porosity of the substrate may be varied by adjusting at least one condition of the type of the substrate, the types, concentrations, and mixture ratio of the chemical materials, an etching temperature and time, and the type of the metal.

The chemical etching process may be performed several times to obtain a desired shape, depth, surface roughness, and porosity using the solutions with different conditions.

The height of the nanostructure for antireflection may be increased by varying the type and thickness of the metal particles, and the size, aspect ratio, and period of the nanostructure for antireflection may be varied according to the shape of the metal particles. The height, inclination, and surface roughness of the nanostructure may be controlled by adjusting the concentrations, amounts, mixture ratio, and temperature of the chemical materials, and the reflectance of the nanostructure may be controlled by adjusting the height, inclination, and surface roughness of the nanostructure.

The subwavelength nanostructure for antireflection may taper or become more porous upward.

When a silicon (Si) substrate having a diamond crystalline structure or the Si substrate having a non-crystalline structure is etched using Si atoms of the photo device using the chemical etching process, the chemical etching process may be performed by adjusting a mixture ratio of $H_2O$, nitric acid ($HNO_3$), and hydrogen fluoride (HF) or a mixture ratio of acetic acid ($CH_3COOH$), $HNO_3$, and HF. When the crystalline Si substrate is chemically etched using $H_2O$, $HNO_3$, and HF, the metal particles may function as an accelerator to accelerate the chemical etching process.

When the Si substrate is chemically etched using $H_2O$, $HNO_3$, and HF, the amount of $H_2O$ may be increased to reduce an etch rate, a variation in etching caused by a rise in the temperature of the solution due to heat generated by a chemical reaction may be reduced using $H_2O$ with a high specific heat.

When the Si substrate is chemically etched using $H_2O$, $HNO_3$, and HF, the nitric acid may oxidize the surface of the Si substrate with the aid of the metal, and HF may melt and remove the oxidized Si.

When the Si substrate is etched using the mixture of $H_2O$, $HNO_3$, and HF and subwavelength silver (Ag) particles, $H_2O$, $HNO_3$, and HF may be mixed in a ratio of 20:1:4 or 20:4:1. Alternatively, the Si substrate may be etched twice using solutions having the two mixture ratios, thereby enabling fabrication of a subwavelength Si nanostructure for antireflection having a low reflectance with respect to a wide wavelength range and a wide incident angle.

When the Si substrate is etched using $H_2O$, $HNO_3$, and HF, as the amount of $H_2O$ decreases or as the concentration of $HNO_3$ increases, an etch rate and height may increase. Also, a Si nanostructure for antireflection may be fabricated to taper or become more porous upward so that the nanostructure can have a low reflectance with respect to a wide wavelength range and a wide incident angle.

When a GaAs substrate of a photo device is etched using the chemical etching process under chemical etching conditions, the chemical etching process may be performed using a mixture of hydrogen peroxide ($H_2O_2$) and HF and metal particles as an etching accelerator. The GaAs substrate may be chemically etched using a mixture of sulfuric acid ($H_2SO_4$) and $H_2O_2$, a mixture of sodium hydroxide (NaOH) and $H_2O_2$, a mixture of citric acid ($C_6H_8O_7$) and $H_2O_2$, a solution obtained by diluting $HNO_3$ with $H_2O$ in a ratio of 20:1, a mixture of $H_2SO_4$ and potassium bromate ($KBrO_3$), or a mixture of hydrochloric acid (HCl), $H_2O_2$, and $CH_3COOH$.

When a Ge substrate of a photo device is etched using the chemical etching process under the chemical etching conditions, the chemical etching process may be performed using a mixture of $CH_3COOH$, $HNO_3$, and HF, a mixture of $HNO_3$, HF, and $H_2O_2$, or a mixture of $HNO_3$, HF, and copper nitrate ($Cu(NO_3)_2$).

When a GaN substrate is etched using the chemical etching process under the chemical etching conditions, the chemical etching process may be performed using a mixture of tartaric acid ($C_4H_6O_6$) and ethylene glycol ($HO(LH_2)_2OH$).

When a GaP substrate is etched using the chemical etching process under the chemical etching conditions, the chemical etching process may be performed using a mixture of $H_2SO_4$ and $KBrO_3$.

When an indium tin oxide (ITO) transparent electrode of a photo device is etched using the chemical etching process under the chemical etching conditions, the chemical etching process may be performed using a halogen acid solution or aqua regia containing a mixture of concentrated $HNO_3$ and concentrated HCl.

When a glass substrate of a photo device is etched using the chemical etching process under the chemical etching conditions, the chemical etching process may be performed using a HF solution, a mixture of HF and HCl, or a mixture of HF, HCl, and $H_2O$. Alternatively, the chemical etching process may be performed using only buffer oxide etch (BOE) or a mixture of BOE and HF.

When the buffer layer is chemically etched under the chemical etching conditions during fabrication of a photo device, the chemical etching process may be performed using a mixture of ammonium fluoride ($NH_4F$), HF, and $H_2O$.

The metal particles used as a mask during the chemical etching process may selectively removed using an additional chemical etching process if required.

When Ag particles are removed using the chemical etching process, the chemical etching process may be performed using a heated $HNO_3$ solution, a mixture of ammonia ($NH_3$) and $H_2O_2$, a mixture of potassium iodide (KI) and iodine ($I_2$), or a mixture of ferric nitrate ($Fe(NO_3)_3$) and $H_2O$.

When gold (Au) particles are removed using the chemical etching process, the chemical etching process may be performed using a mixture of KI and $I_2$.

When platinum (Pt) particles are removed using the chemical etching process, the chemical etching process may be performed using aqua regia containing a mixture of concentrated $HNO_3$ and concentrated HCl or by heating a mixture of $HNO_3$ and HCl.

When copper (Cu) particles are removed using the chemical etching process, the chemical etching process may be performed using a mixture of HCl and ferric chloride ($FeCl_3$) or a mixture of $NH_3$, sodium hypochlorite (NaOCl), and ammonium carbonate (($NH_4)_2CO_3$).

When aluminum (Al) particles are removed using the chemical etching process, the chemical etching process may be performed using a mixture of phosphoric acid ($H_3PO_4$) and $HNO_3$ or a mixture of $H_3PO_4$, $HNO_3$, and $CH_3COOH$.

According to still another exemplary embodiment, a method of fabricating a photo device integrated with a nanostructure for antireflection is provided. When the photo device is a light emitting device, the method includes: (a) sequentially stacking an n-type doped layer, an active layer, and a p-type doped layer and coating a solution containing a combination of metal ions and organic or inorganic ions on a top surface of a light emitting unit of the p-type doped layer; (b) sintering the coated solution using an annealing process to grow nanoscale metal particles; and (c) chemically etching the top surface of the light emitting unit of the p-type doped layer using the metal particles as a mask or accelerator to form a subwavelength nanostructure for antireflection on the top surface of the light emitting unit of the p-type doped layer, the nanostructure being configured to taper upward. When the photo device is a light receiving device, the method includes: (a') sequentially stacking a p-type doped layer, an active layer, and an n-type doped layer and coating a solution containing a combination of metal ions and organic or inorganic ions on a top surface of a light receiving unit of the n-type doped layer; (b') sintering the coating solution using an annealing process to grow nanoscale metal particles; (c') chemically etching the top surface of the light receiving unit of the n-type doped layer using the metal particles as a mask or accelerator to form a subwavelength nanostructure for antireflection on the top surface of the light receiving unit of the n-type doped layer, the nanostructure being configured to taper upward.

When the photo device is the light emitting device, the method may further include stacking a p-type upper electrode on a top surface of the p-type doped layer except the light emitting unit and stacking an n-type lower electrode on a bottom surface of the n-type doped layer before coating the solution in step (a) or after step (c). Also, when the photo device is the light receiving device, the method may further include stacking an n-type upper electrode on a top surface of the n-type doped layer except the light receiving unit and stacking a p-type lower electrode on a bottom surface of the p-type doped layer before coating the solution in step (a') or after step (c').

When the photo device is the light emitting device, the method may further include stacking a transparent electrode on the entire surface of the p-type doped layer including the nanostructure for antireflection, stacking a contact pad on a top surface of the transparent electrode except the light emitting unit, and stacking an n-type lower electrode on a bottom surface of the n-type doped layer after step (c). Also, when the photo device is the light receiving device, the method may further include stacking a transparent electrode on the entire surface of the n-type doped layer including the nanostructure for antireflection, stacking a contact pad on a top surface of the transparent electrode except the light receiving unit, and stacking a p-type lower electrode on a bottom surface of the p-type doped layer after step (c').

According to yet another exemplary embodiment, a method of fabricating a photo device integrated with a nanostructure for antireflection is provided. When the photo device is a light emitting device, the method includes: sequentially stacking an n-type doped layer, an active layer, and a p-type doped layer and stacking a transparent electrode or buffer layer on a top surface of the p-type doped layer except a light emitting unit; coating a solution containing a combination of metal ions and organic or inorganic ions on a top surface of the transparent electrode or buffer layer; sintering the coated solution using an annealing process to grow nanoscale metal particles; performing a chemical etching process using the metal particles as a mask or accelerator to change the transparent electrode or buffer layer into a nanostructure transparent electrode or nanostructure buffer layer; chemically etching a top surface of the light emitting unit of the p-type doped layer using the nanostructure transparent electrode or transparent buffer layer and the metal particles as a mask or accelerator to form a subwavelength nanostructure for antireflection on the top surface of the light emitting unit of the p-type doped layer, the nanostructure for antireflection being configured to taper upward; and stacking a p-type upper electrode on the top surface of the p-type doped layer except the light emitting unit and stacking an n-type lower electrode on a bottom surface of the n-type doped layer. When the photo device is a light receiving device, the method includes: sequentially stacking a p-type doped layer, an active layer, and an n-type doped layer and stacking a transparent electrode or buffer layer on a top surface of a light receiving unit of the n-type doped layer; coating a solution containing a combination of metal ions and organic or inorganic ions on a top surface of the transparent electrode or buffer layer; sintering the coated solution using an annealing process to grow nanoscale metal particles; performing a chemical etching process using the metal particles as a mask or accelerator to change the transparent electrode or buffer layer into a nanostructure transparent electrode or buffer layer; chemically etching the top surface of the light receiving unit of the n-type doped layer using the nanostructure transparent electrode or nanostructure buffer layer and the metal particles as a mask or accelerator to form a subwavelength nanostructure for antireflection on the top surface of the light receiving unit of the n-type doped layer, the nanostructure for antireflection being configured to taper upward; and stacking an n-type upper electrode on a top surface of the n-type doped layer except the light receiving unit and stacking a p-type lower electrode on a bottom surface of the p-type doped layer.

According to yet another exemplary embodiment, a method of fabricating a photo device integrated with a nanostructure for antireflection includes: (a") sequentially stacking a bottom cell layer, a middle cell layer, and a top cell layer and coating a solution containing a combination of metal ions with organic or inorganic ions on a top surface of the top cell layer except a p-type upper electrode; (b") changing the coated solution into nanoscale metal particles; and (c") chemically etching the top surface of the top cell layer except the p-type upper electrode using the metal particles as a mask or reaction accelerator to form a subwavelength nanostructure for antireflection on a top surface of the top cell layer except the p-type upper electrode, the nanostructure for antireflection being configured to taper upward.

Before coating the solution in step (a") or after step (c"), the method may further include stacking a p-type upper electrode on a top surface of one side of the top cell layer and stacking an n-type lower electrode on a bottom surface of the bottom cell layer.

According to yet another exemplary embodiment, a method of fabricating a photo device integrated with a nanostructure for antireflection includes: coating a solution containing a combination of metal ions with organic or inorganic ions on top and bottom surfaces of a substrate; changing the coated solution into nanoscale metal particles using an annealing process; and chemically etching the top and bottom surfaces of the substrate using the metal particles as a mask or a reaction accelerator to form a subwavelength nanostructure for antireflection on the top and bottom surfaces of the substrate, the nanostructure for antireflection being configured to taper upward.

The substrate may be a transparent glass or a substrate having both surfaces polished and formed of one selected from the group consisting of Si, gallium arsenic (GaAs), gallium nitride (GaN), and sapphire.

Advantageous Effects of Invention

According to a method of fabricating a subwavelength nanostructure for anti-reflection and a method of fabricating a photo device integrated with a nanostructure for antireflection as described above, a solution containing a combination of metal ions with organic or inorganic ions may be coated on a substrate, the coated solution may be annealed using a sintering process to generate nanoscale metal particles, and a chemical etching process may be performed using the metal particles. As a result, the subwavelength nanostructure for antireflection may be fabricated without an apparatus requiring a vacuum state using a simple method for a short amount of process time. Thus, reflection of light generated between a semiconductor material and the air may be minimized, and the nanostructure for antireflection may be integrated in a photo device, such as a solar cell, a photodetector, a light emitting device, or a transparent glass, to produce devices with good luminous efficiency and performance at low cost in large quantities.

Furthermore, according to the present invention, even if a substrate has a step difference, a wafer-scale process may be enabled. Also, a subwavelength nanostructure may be fabricated on the substrate through a chemical etching process using metal particles having a controllable size. Thus, a nanostructure for antireflection having a low reflectance with respect to a wide wavelength range and a wide incident angle and a highly efficient photo device integrated with the nanostructure for antireflection may be fabricated.

BEST MODE FOR CARRYING OUT THE INVENTION

Hereinafter, exemplary embodiments of the present invention will be described in detail. However, the present invention is not limited to the exemplary embodiments disclosed below, but can be implemented in various types. Therefore, the present exemplary embodiments are provided for complete disclosure of the present invention and to fully inform the scope of the present invention to those ordinarily skilled in the art.

Embodiment 1

FIGS. 1 through 4 are cross-sectional views illustrating a method of fabricating a nanostructure for antireflection according to a first exemplary embodiment of the present invention.

Figure 1:
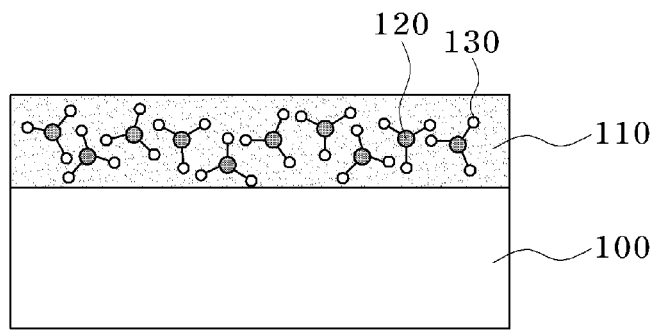
FIGS. 1 through 4 are cross-sectional views illustrating a method of fabricating a nanostructure for antireflection according to a first exemplary embodiment of the present invention.

Referring to FIG. 1, a solution 110 containing a combination of metal ions 120 with organic or inorganic ions 130 is uniformly coated on a top surface of a prepared semiconductor substrate 100.

For example, the substrate 100 may be a semiconductor substrate, which is not limited to a silicon (Si) substrate. Other than the semiconductor substrate, the substrate 100 may be any substrate that causes a reaction only in a portion containing metal particles (refer to 125 of FIG. 2) or accelerates the reaction in the portion containing the metal particles 125 more than the remaining portion because the metal particles 125 accelerate a chemical etching reaction.

Also, the metal ions 120 may be ions of any metal that may be bonded to the organic or inorganic ions 130 and contained in the solution 110 and changed into subwavelength metal particles (or metal grains) 125 using a sintering process.

Here, the thickness of the coated solution 110 may be adjusted according to a method of controlling the concentration of the metal ions 120 in the solution, a coating apparatus, coating conditions of the apparatus, and a sintering temperature and time. The solution 110 may be coated to a thickness of about 1 to 500 nm so that the solution 110 may be changed into subwavelength metal particles 125 after a sintering process.

Figure 2:
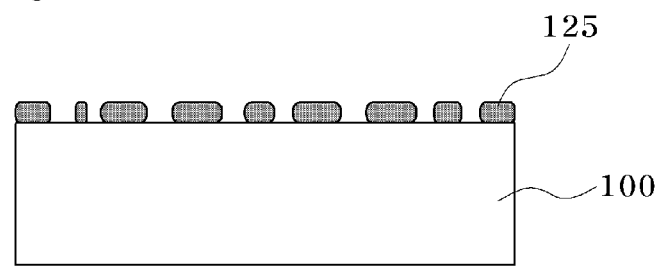

Referring to FIG. 2, any apparatus capable of annealing the solution 110 containing a combination of the metal ions 120 with organic or inorganic ions 130 to form the metal particles 125 may be employed.

The annealing process may be performed in a nitrogen ($N_2$) atmosphere to prevent oxidation of the metal particles 125 and increase reproducibility and reliability with respect to the size and thickness of the metal particles 125.

In this case, the annealing temperature and time may be selected to break down polymer chains of the metal ions 120 and the organic ions 130 or ionic bonds between the metal ions 120 and the inorganic ions 130 and form the subwavelength metal particles 125.

Figure 3:
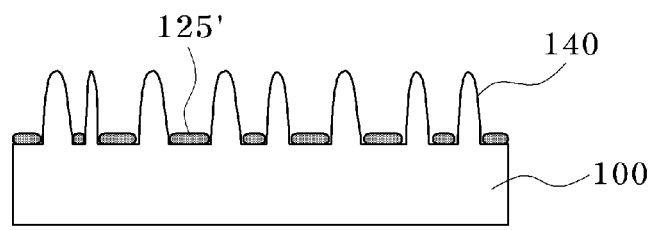

Referring to FIG. 3, the metal particles 125 may, for example, function as an accelerator of a chemical reaction in the substrate 100 containing the metal particles 125 so that only a portion of the substrate 100 that contains the metal particles 125 may be etched or the portion of the substrate 100 may be etched at a higher rate than the remaining portion. Thus, a nanostructure 140 for antireflection may be formed on a top surface of the substrate 100 to have an irregular period of about 10 to 1000 nm and a depth of about 50 to 1,000 nm, that is, a subwavelength period.

Figure 4:
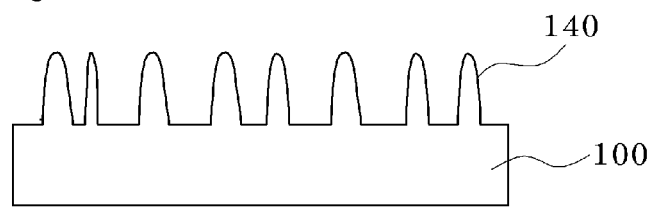

Referring to FIG. 3, metal particles 125' may remain on the top surface of the substrate 100 after a chemical etching process according to circumstances, and an additional chemical etching process may be performed if required, thereby removing the remaining metal particles 125' as shown in FIG. 4.

The resultant nanostructure 140 for antireflection may be non-periodically arranged on the surface of the substrate 100 according to the shape and arrangement of the metal particles 125. Although the nanostructure 140 for antireflection may have a cone shape, which may taper upward from the surface of the substrate 100 to an air layer, the present invention is not limited thereto. For example, the nanostructure 140 for antireflection may have porosity and the shape of a triangular pyramid, a square pillar, a polygonal pillar, a truncated cone, or an irregular pillar.

Meanwhile, the type of a solution used for the chemical etching process may be varied according to, for example, the kinds of the substrate 100 and the metal particles 125. The height, inclination, surface state, and porosity of the nanostructure 140 for anti-reflection may be adjusted by controlling at least one of the type, concentration, amount, mixture ratio, and temperature of a chemical material and an etching time, thereby obtaining a desired depth and aspect ratio and controlling a section and reflectance of an antireflection region.

A transparent electrode may be stacked on the top surface of the substrate 100 on which the nanostructure 140 for anti-reflection is integrated and applied to the fabrication of a photo device if required.

Figure 5:
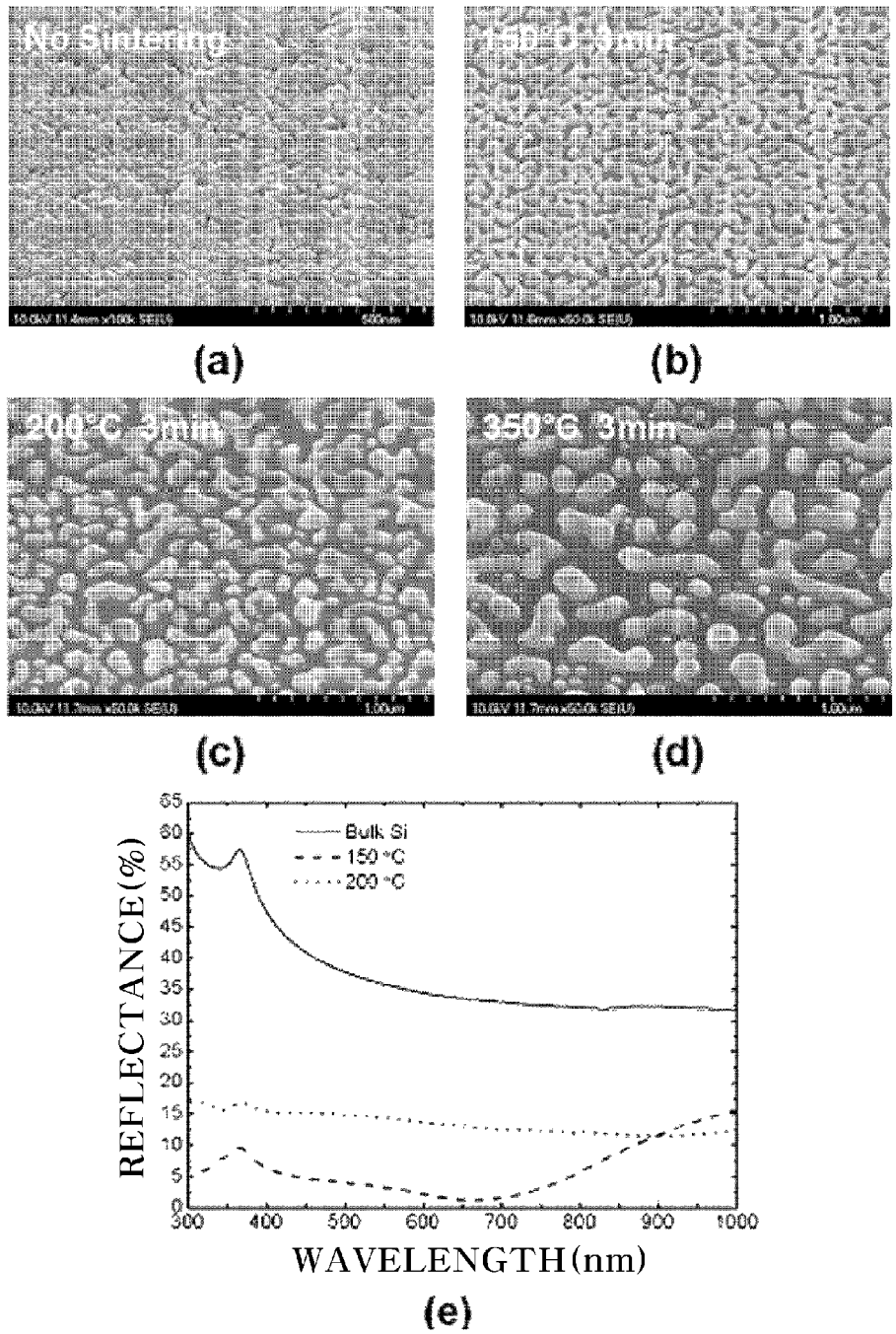
FIG. 5 shows scanning electron microscope (SEM) images and a graph of reflectance of subwavelength metal particles relative to a sintering temperature according to the first exemplary embodiment of the present invention.

FIG. 5 shows scanning electron microscope (SEM) images of subwavelength metal ions (refer to 125 in FIG. 2) fabricated on a silicon substrate according to the first exemplary embodiment of the present invention. In FIG. 5, (a) shows a coated material obtained by diluting 10% by weight combination of silver (Ag) ions with organic ions in a solution with isopropyl alcohol in a ratio of 1:2 and coating the diluted solution at a rate of 5,000 revolutions per minute (rpm) for about 20 seconds using a spin coating process, (b) shows a resultant material obtained by annealing the coated material (a) in a $N_2$ atmosphere at a temperature of about 150 C on a hot plate for 3 minutes, (c) shows a resultant material obtained by annealing the coated material (a) in the $N_2$ atmosphere at a temperature of about 200 C on the hot plate for 3 minutes, and (d) shows a resultant material obtained by annealing the coated material (a) in the $N_2$ atmosphere at a temperature of about 350° C. on the hot plate for 3 minutes.

From (a) through (d) of FIG. 5, it may be confirmed that metal particles 125 having a non-periodic arrangement may be formed on the substrate 100 using the sintering process, and as the sintering temperature increases, the size, thickness, and inter-particle distance of the metal particles 125 also increase. Also, it can be seen that the metal particles 125 may be controlled according to the sintering conditions.

Also, (e) of FIG. 5 shows reflectances of Si antireflection structures having sub-wavelengths obtained by etching the resultant materials (b) and (c) using a mixture of 200 ml of $H_2O$, 10 ml of nitric acid ($HNO_3$), and 40 ml of hydrogen fluoride (HF) for the same etch time. As a result, it may be concluded that the size, thickness, inter-particle distance, and period, which may depend on the sintering conditions, may affect the reflectance of the antireflection structure.

Figure 6:
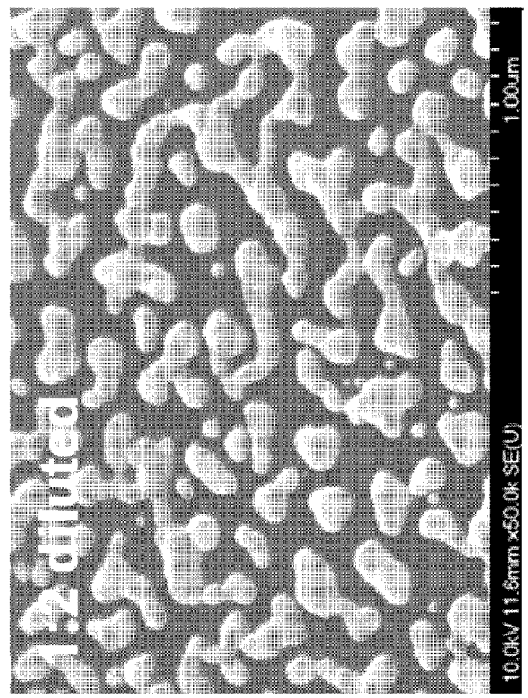
FIG. 6 shows SEM images of subwavelength metal particles relative to a dilution ratio according to the first exemplary embodiment of the present invention.
Figure 6:
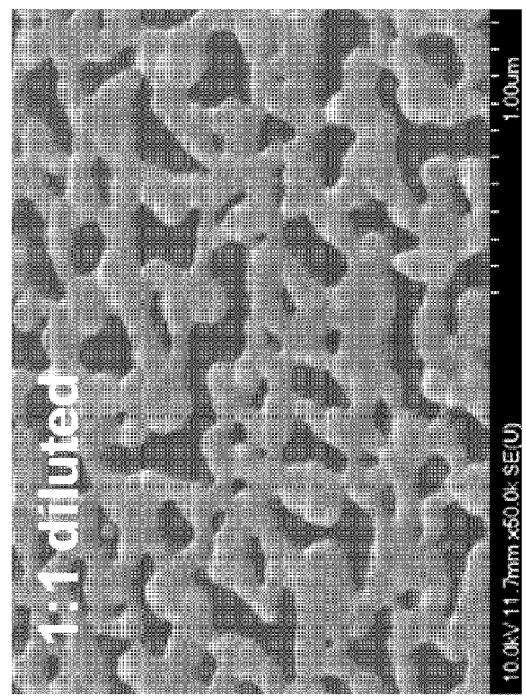

FIG. 6 shows SEM images of subwavelength metal ions relative to a dilution ratio in the nanostructure for antireflection fabricated according to the first exemplary embodiment of the present invention. FIG. 6 shows SEM images of metal particles obtained by diluting 10% by weight combination of Ag ions with organic ions in a solution with isopropyl alcohol in a ratio of 1:1 (refer to (a) of FIG. 6) and a ratio of 1:2 (refer to (b) of FIG. 6), coating the diluted solution on a Si substrate at a rate of 5,000 rpm for about 20 seconds and annealing the coated solution in a $N_2$ atmosphere for about 250 C for 3 minutes. Referring to FIG. 6, it may be seen that the dilution ratio affects the size, thickness, and inter-particle distance of the metal particles (refer to 125 of FIG. 2).

Figure 7:
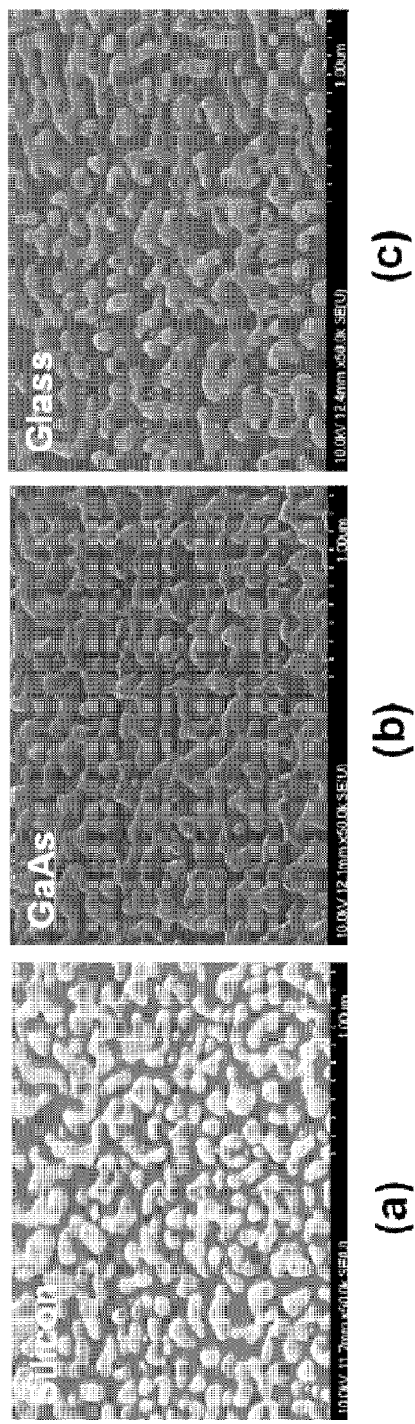
FIG. 7 shows SEM images of subwavelength metal particles according to the type of a substrate according to the first exemplary embodiment of the present invention.

FIG. 7 shows SEM images of subwavelength metal particles according to the type of a substrate according to the first exemplary embodiment of the present invention. FIG. 7 shows SEM images of metal particles obtained by diluting 10% by weight combination of Ag ions with organic ions in a solution with isopropyl alcohol in a ratio of 1:2, coating the diluted solution on a Si substrate (refer to (a) of FIG. 7), a gallium arsenic (GaAs) substrate (refer to (b) of FIG. 7), and a transparent glass substrate (refer to (c) of FIG. 7) at a rate of about 5,000 rpm for about 20 seconds and annealing the coated solution in a $N_2$ atmosphere for about 200 C for 3 minutes. Referring to FIG. 7, it may be seen that the size, thickness, and inter-particle distance of the metal particles (refer to 125 of FIG. 2) are varied according to the type of a substrate because different substrates have different thermal conductivities, surface energies, and surface tensions.

Figure 8:
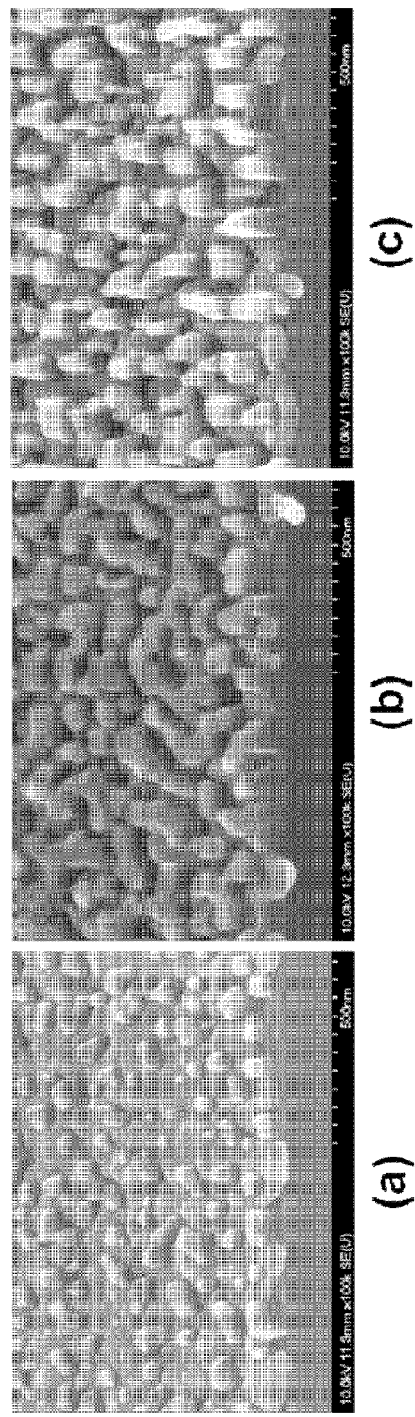
FIG. 8 shows SEM images of a silicon (Si) subwavelength nanostructure for anti-reflection relative to an increase in chemical etching time according to the first exemplary embodiment of the present invention.

FIG. 8 shows SEM images of a Si subwavelength nanostructure for anti-reflection relative to an increase in chemical etching time according to the first exemplary embodiment of the present invention. The SEM images show a process of forming the Si nanostructure for antireflection over etch time using a mixture of Ag particles, 200 ml of water ($H_2O$), 10 ml of $HNO_3$, and 40 ml of HF.

Referring to FIG. 8, it can be confirmed that a portion of the Si substrate containing Ag particles (refer to 100 of FIG. 3) is gradually etched to a greater depth using the Ag particles as an accelerator and an irregular Si nanostructure for antireflection having a truncated cone shape is fabricated.

Figure 9:
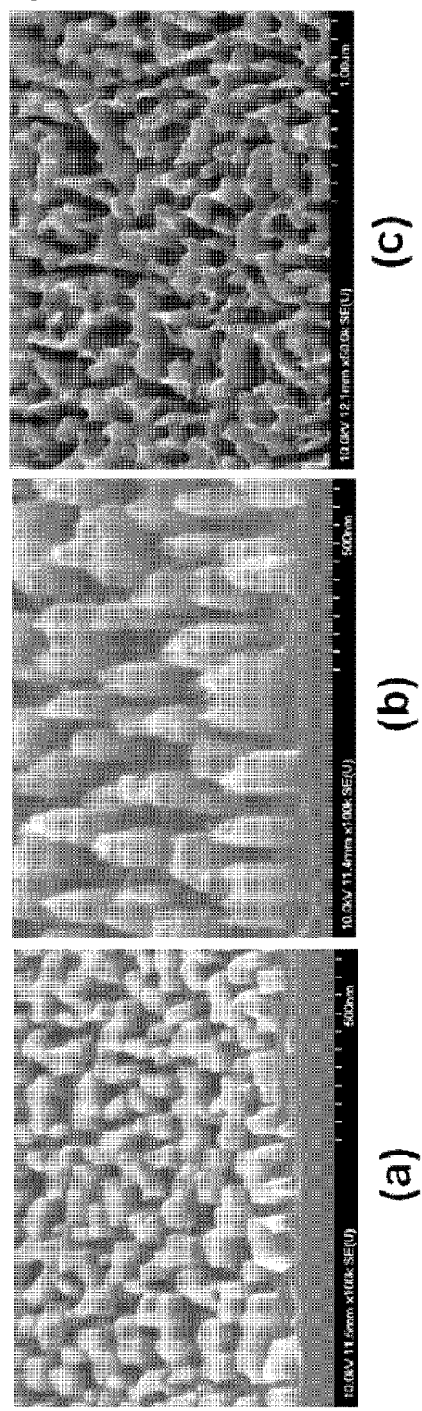
FIG. 9 shows SEM images of the Si subwavelength nanostructure for anti-reflection relative to the concentration of a chemical solution according to the first exemplary embodiment.

FIG. 9 shows SEM images of the Si subwavelength nanostructure for anti-reflection relative to the concentration of a chemical solution according to the first exemplary embodiment of the present invention. The SEM images show an etched extent of Si relative to a ratio of $HNO_3$ and HF to a mixture of $H_2O$, $HNO_3$, and HF and an etched extent of Si relative to the amount of $H_2O$ Referring to FIG. 9, when comparing a case using a mixture of 200 ml of $H_2O$, 10 ml of $HNO_3$, and 40 ml of HF (refer to (a) of FIG. 9) with a case using a mixture of 200 ml of $H_2O$, 40 ml of $HNO_3$, and 10 ml of HF (refer to (b) of FIG. 9), it may be confirmed that as the concentration of $HNO_3$ increases (or as a ratio of $HNO_3$ to the mixture increases), the height, surface roughness, etch rate, and porosity of the nanostructure for antireflection may increase.

When the concentration or ratio of $HNO_3$ used to oxidize Si is increased, the oxidized rate and amount of the Si may increase, and the range of an oxidizing power may also increase. Accordingly, it may be seen that the Si nanostructure for antireflection may be etched to a greater depth and in a rougher shape and become more porous.

Furthermore, case (c) of FIG. 9 shows a result of a chemical etching process using a mixture of 150 ml of $H_2O$, 40 ml of $HNO_3$, and 10 ml of HF. From case (c) of FIG. 9, it can be seen that as the concentration of a chemical solution increases with a reduction in the amount of $H_2O$, an etch rate may increase and the shape of the nanostructure for antireflection may be affected.

Figure 10:
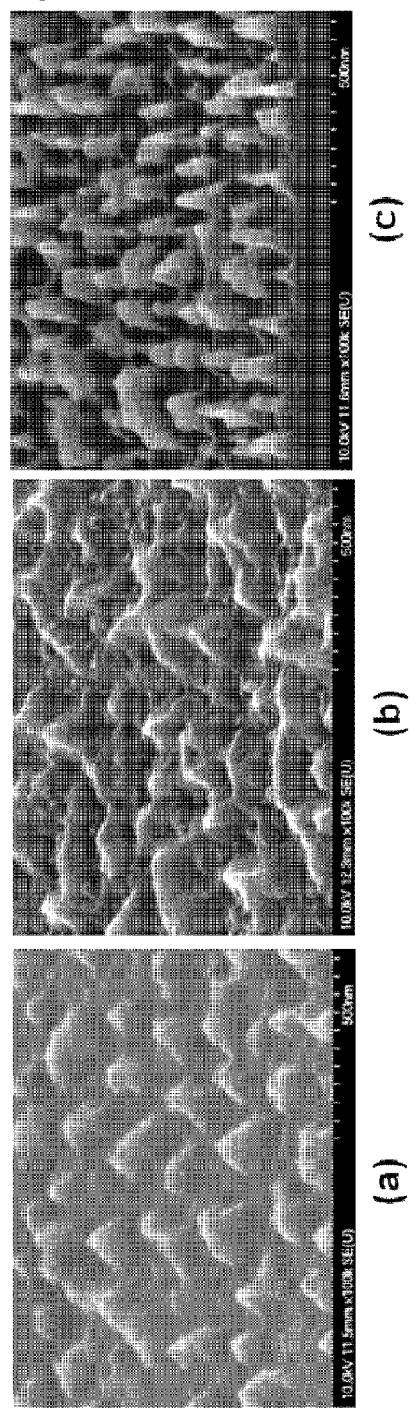
FIG. 10 shows SEM images of a Si subwavelength nanostructure for anti-reflection, which is fabricated according to the first exemplary embodiment of the present invention.

FIG. 10 shows SEM images of a Si subwavelength nanostructure for anti-reflection, which is fabricated according to the first exemplary embodiment of the present invention. The SEM images show a result of a chemical etching process performed under different conditions of a mixture of $H_2O$, $HNO_3$, and HF and an etching order.

Referring to FIG. 10, it may be seen that a Si nanostructure for antireflection may be fabricated in an irregularly broken pyramid shape (refer to (a) of FIG. 10), a connected polygonal pillar shape (refer to (b) of FIG. 10), or a cone shape (refer to (c) of FIG. 10) configured to taper upward.

Figure 11:
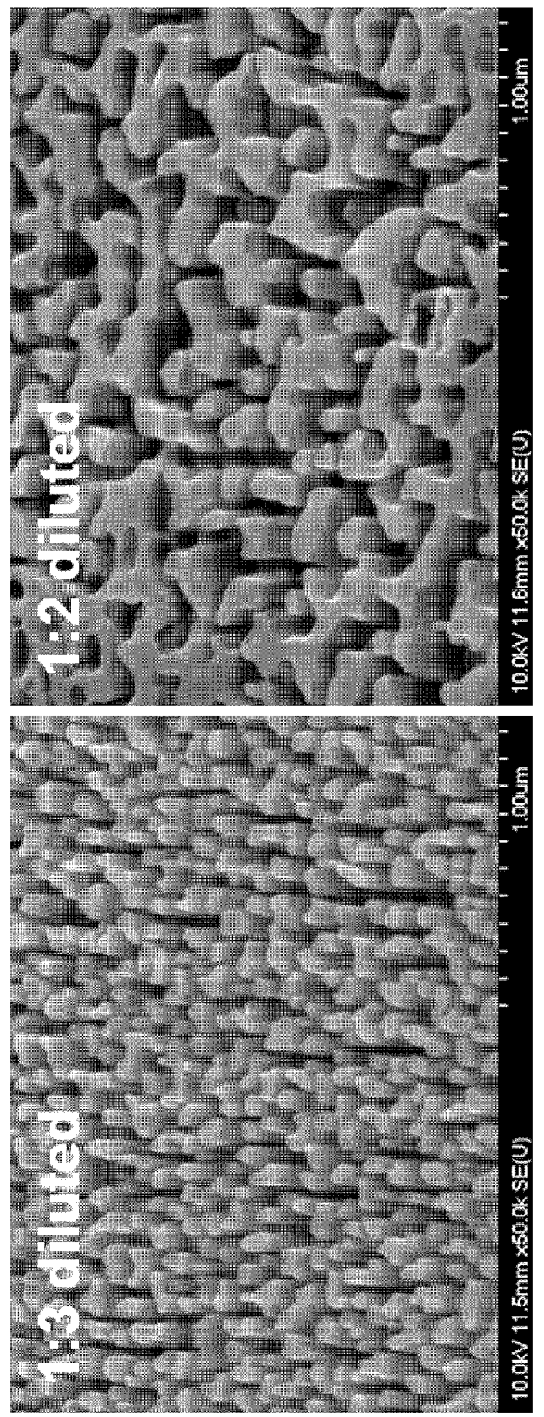
FIG. 11 shows SEM images of a Si subwavelength nanostructure for anti-reflection, which is fabricated according to the first exemplary embodiment of the present invention.

FIG. 11 shows SEM images of a Si subwavelength nanostructure for anti-reflection, which is fabricated according to the first exemplary embodiment of the present invention. The SEM images of FIG. 11 show the influence of the size of Ag particles, which is varied according to a dilution ratio of isopropyl alcohol, on a chemical etching process when a solution contains 10 percent by weight combination of Ag ions with organic ions.

Referring to FIG. 11, a solution obtained by diluting the combination of the Ag ions and the organic ions with isopropyl alcohol in a ratio of 1:3 (refer to (a) of FIG. 11) and a ratio of 1:2 (refer to (b) of FIG. 11) is spin-coated at about 5,000 rpm for about 20 seconds, annealed in a $N_2$ atmosphere at a temperature of about 150 C for about 3 minutes, and chemically etched using a mixture of 200 ml of $H_2O$, 10 ml of $HNO_3$, and 40 ml of HF. Thus, it can be seen that in case (a) of FIG. 11 where Ag particles are formed to finer, smaller sizes, a Si nanostructure for antireflection having a finer, shorter wavelength period is formed.

Figure 12:
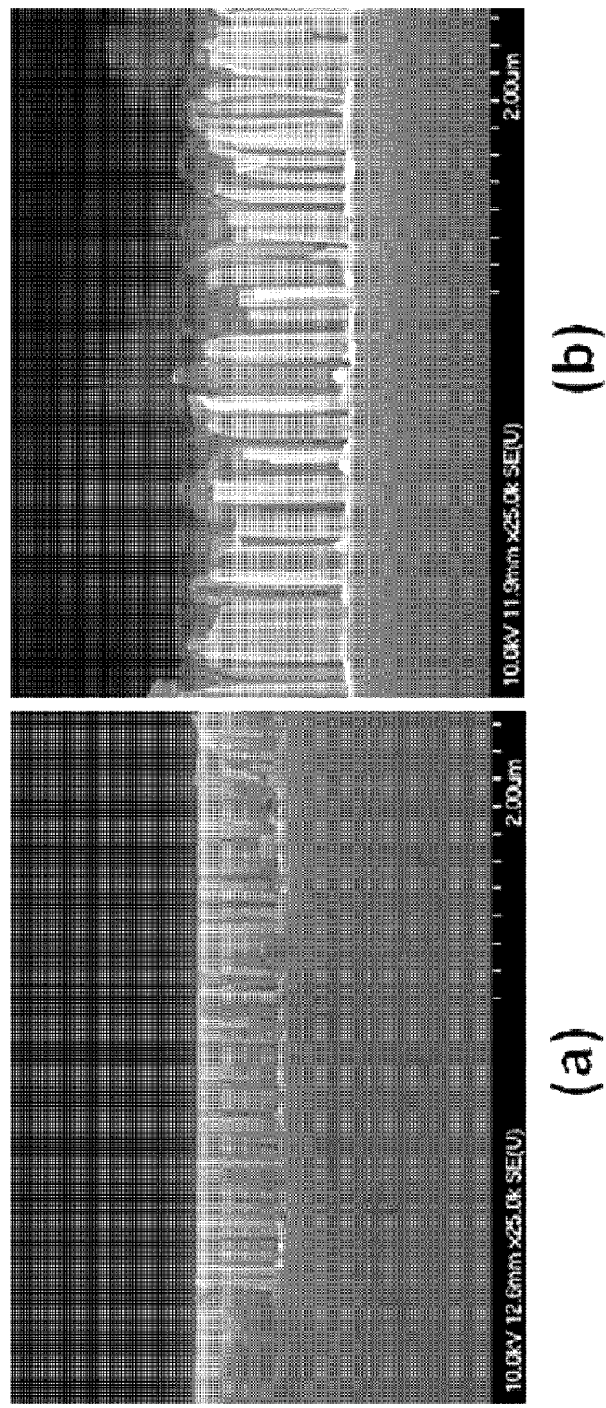
FIG. 12 shows SEM images of a Si subwavelength nanostructure for anti-reflection, which is fabricated according to the first exemplary embodiment of the present invention.

FIG. 12 shows SEM images of a Si subwavelength nanostructure for anti-reflection, which is fabricated according to the first exemplary embodiment of the present invention. The SEM images of FIG. 12 show a comparison of etching results between case (a) where a top surface of a Si substrate was faced upward and etched for about 10 minutes using a mixture of 150 ml of $H_2O$, 40 ml of $HNO_3$, and 10 ml of HF and case (b) where the top surface of the Si substrate is faced downward and etched under the same conditions.

Referring to FIG. 12, it can be seen that as an etch time increases, an etched depth increases. Also, it may be confirmed that when the top surface of the substrate is faced upward, since large amounts of chemical materials having high specific gravity remain on the surface of the Si substrate for a long duration of time, an etch rate may be higher than when the top surface of the Si substrate is faced downward. Thus, it can be seen that even if Ag particles are disposed below, an etching reaction occurs in a direction from the top surface containing Ag particles toward a bottom surface having the largest contact area between the Ag particles and Si due to electrochemical etching mechanism of Si.

Figure 13:
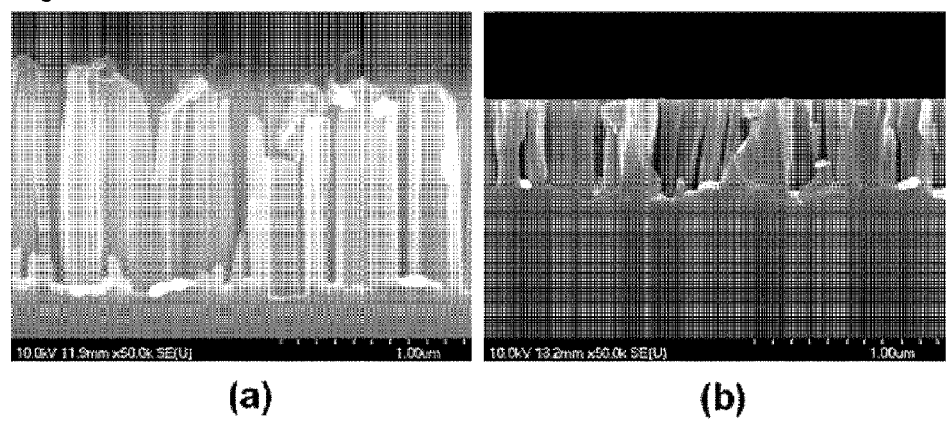
FIG. 13 shows SEM images and a graph of reflectance of the Si subwavelength nanostructure for antireflection relative to the thickness of metal particles according to the first exemplary embodiment of the present invention.
Figure 13:
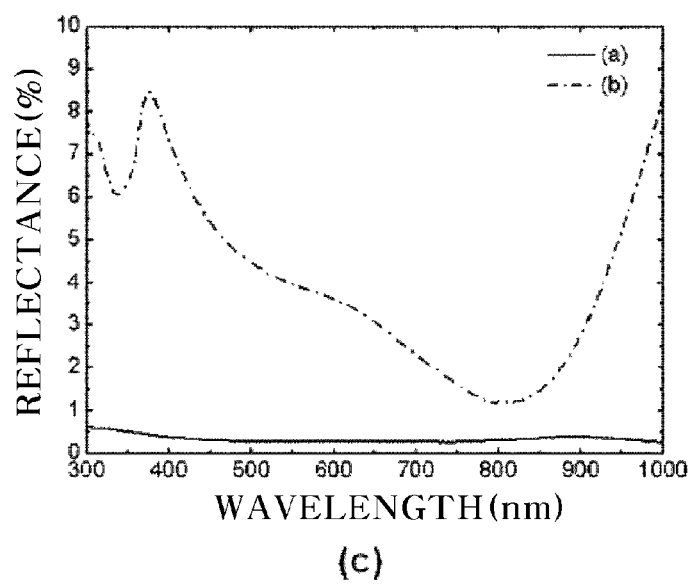

FIG. 13 shows SEM images and a graph of reflectance of the Si subwavelength nanostructure for antireflection fabricated using metal particles having different thicknesses according to the first exemplary embodiment of the present invention. Referring to FIG. 13, it may be seen that an etch depth in case (a) where Ag particles have a great thickness is greater than in case (b) where Ag particles have a small thickness. Also, from case (c) of FIG. 13, it may be seen that as an etch depth increases, the reflectance of the nanostructure for antireflection may be greatly reduced over a wide wavelength range.

Figure 14:
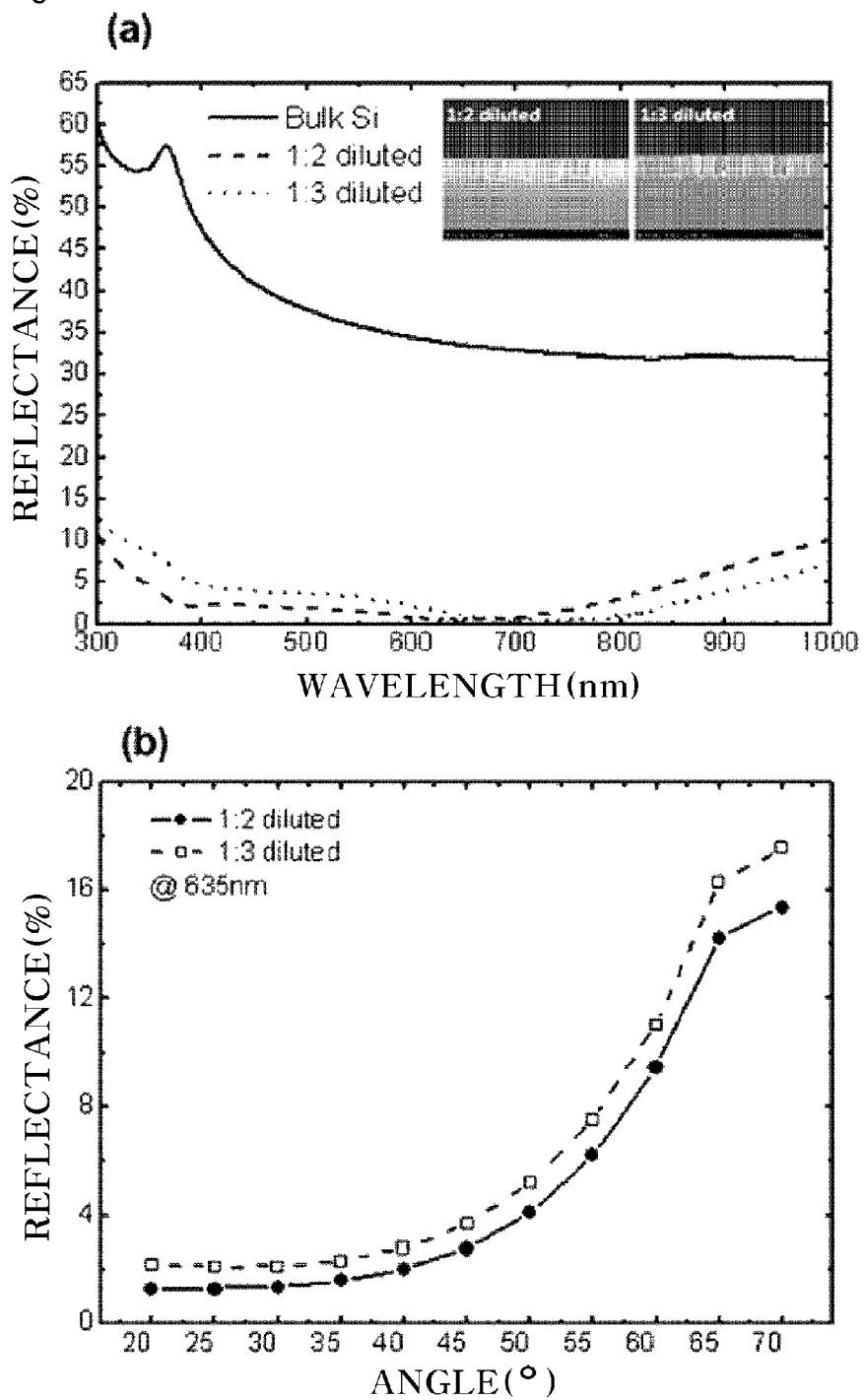
FIG. 14 is a graph showing the reflectance of the Si subwavelength nanostructure for antireflection fabricated according to the first exemplary embodiment of the present invention.

FIG. 14 is a graph showing the reflectance of the Si subwavelength nanostructure for antireflection fabricated according to the first exemplary embodiment of the present invention. FIG. 14 shows the reflectance of the nanostructure for antireflection in case (a) where light is vertically incident and case (b) where light with a wavelength of 635 nm is incident at different angles.

Referring to FIG. 14, the reflectance of a Si nanostructure (refer to 140 in FIG. 4) for antireflection fabricated using a simple method without a vacuum apparatus is at least about 30% or higher in the case of a typical Si substrate. By comparison, it can be confirmed from case (a) that the reflectance of a Si nanostructure for antireflection (Si SWS) having a height of about 150 nm or less is about 15% or less in a wide wavelength range and about 5% or less in a visible light range. From case (b) of FIG. 14, which shows a variation in reflectance relative to incident angle measured using a 635 nm-wavelength light source, it can be confirmed that the nanostructure for anti-reflection has a low reflectance even at a wide incident angle.

Importantly, the nanostructure for antireflection, which exhibits a low reflectance despite a height of about 150 nm, may solve the restrictions of thin-film solar cells, compound solar cells, photodetectors, and emitting diodes in which the thickness of a layer where the nanostructure for antireflection is to be formed is limited.

Figure 15:
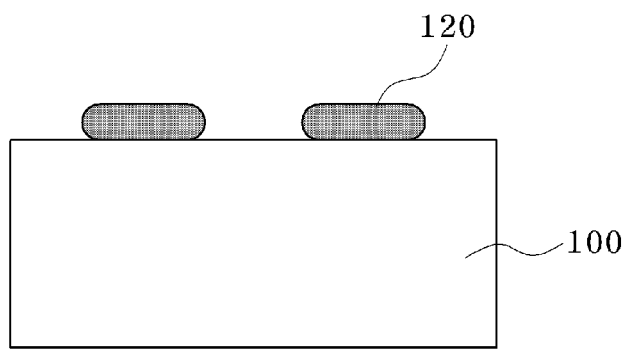
FIG. 15 is a cross-sectional view illustrating a chemical etching process according to the first exemplary embodiment of the present invention to facilitate the understanding of an electrochemical etching mechanism.
Figure 15:
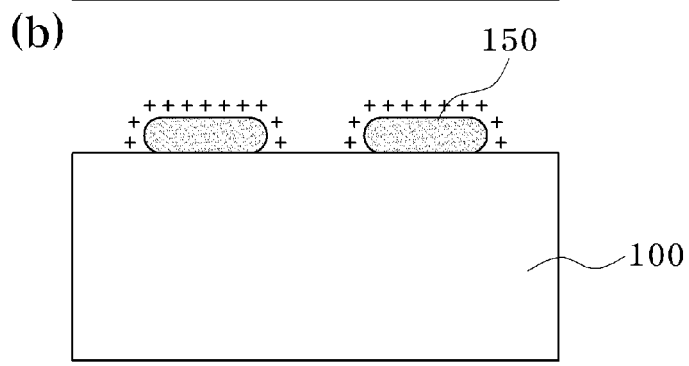
Figure 15:
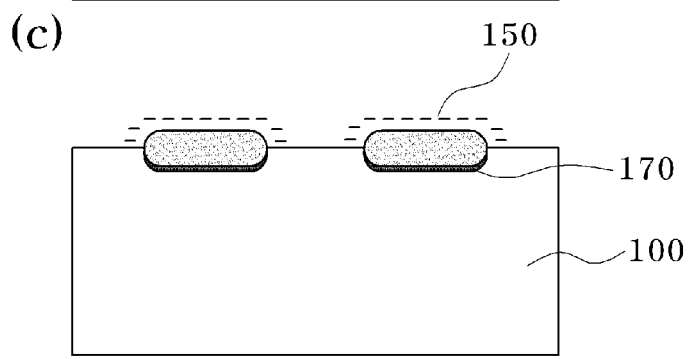
Figure 15:
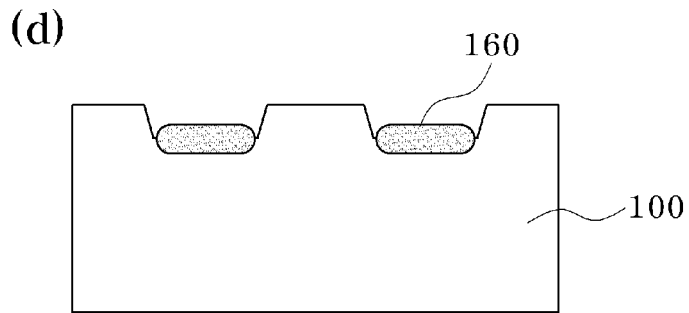

FIG. 15 is a cross-sectional view illustrating a chemical etching process according to the first exemplary embodiment of the present invention to facilitate the understanding of an electrochemical etching mechanism.

Referring to (a) of FIG. 15, Ag particles 120 are sintered on a Si substrate 100. When the sintered Ag particles 120 are contained in a mixture of $H_2O$, $HNO_3$, and HF, as shown in (b)

of FIG. 15, Ag⁺ ions may be generated on the surface and in the vicinity of the Ag particles 120 by a reaction of the Ag particles 120 with the $HNO_3$, and the Ag particles 120 may be changed into changed Ag particles 120.

Since the Ag⁺ ions have a higher electrochemical energy than Si, as shown in (c) of FIG. 15, the Ag⁺ ions strongly attract electrons from a Si valence band, and Si atoms within an effective range in which the Ag⁺ ions may strongly attract the electrons from the Si valence band due to the electrochemical energy are deprived of electrons and changed into Si oxide ($SiO_2$) 170.

As a result, as shown in (d) of FIG. 15, the Ag particles receive the electrons and are changed into a state 160 where Ag⁻ ions exist on the surfaces of the Ag particles. Thus, a Si oxide layer 170 is etched and removed using HF using a series of complicated processes. As a result, while chemically etching the vicinity of the Si oxide layer 170 where Ag particles exist, the Si substrate 100 is gradually etched to a greater depth from the top surface thereof toward the bottom surface thereof, and the subwavelength Si nanostructure for antireflection may be formed.

As can be seen from FIG. 12, it may be understood why the Si substrate 100 is etched in a vertical direction due to the above-described mechanism even if the top surface of the Si substrate 100 faces downward. That is, this is because an electrochemical reaction actively occurs mainly in a portion adjacent to the Si substrate 100. Thus, the Si substrate 100 is etched from the top surface thereof toward the bottom surface thereof in a vertical direction to the surface of the Si substrate 100 that contacts the largest number of Ag particles 120. Accordingly, by allowing chemical materials having high specific gravity to remain between the Ag particles 120 and the Si substrate 100 for a long time, an etch rate and depth may be increased.

Figure 16:
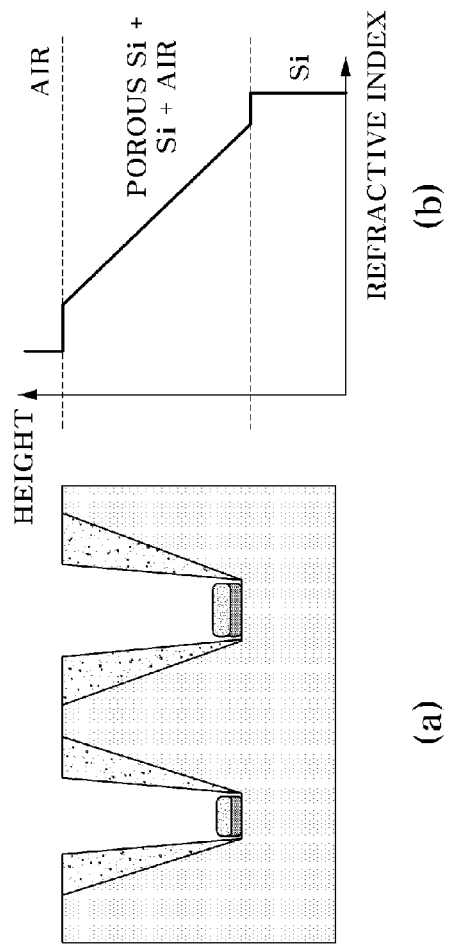
FIG. 16 shows a cross-sectional view (a) illustrating a method of fabricating the nanostructure for antireflection according to the first exemplary embodiment of the present invention and a graph showing a variation (b) in refractive index relative to the depth of the nanostructure for anti-reflection.

FIG. 16 shows a cross-sectional view (a) illustrating a method of fabricating the nanostructure for antireflection according to the first exemplary embodiment of the present invention and a graph (b) showing a variation in refractive index relative to the depth of the nanostructure for antireflection. FIG. 16 schematically shows detailed etched results of Si due to a chemical etching reaction.

FIG. 16 is a diagram for explaining the reason why a subwavelength Si nanostructure having a truncated cone shape exhibits a low reflectance in a wide wavelength range and a wide incident angle, even though the subwavelength Si nanostructure has a height of about 150 nm as shown in FIG. 14. In general, to reduce the reflectance of a subwavelength Si nanostructure in a wide wavelength range and a wide incident angle, the subwavelength Si nanostructure should have a parabolic shape or a cone shape so that the Si nanostructure has a gradually reduced refractive index upward and a height of at least about 200 nm or more.

However, the Si nanostructure shown in FIG. 14 may have good anti-reflection properties because an inclined nanostructure is formed as shown in (a) of FIG. 16 during the etching of a Si substrate, Si within an effective range may be deprived of electrons due to high electrochemical energy of Ag⁺ ions, and some of the Si may be completely changed into silicon oxide ($SiO_2$) and etched by fluorine (F) and hydrogen (H) or only some of the Si may be changed into silicon oxide ($SiO_2$), etched, and changed into microporous (or porous) Si 180 having a lower refractive index than Si.

As an etch rate or duration of time for which the porous Si 180 is exposed to the solution increases, the porosity of the porous Si 180 may increase. Also, the refractive index of the porous Si 180 may be varied from the refractive index (about 3.58) of Si to the refractive index (1) of the air. Thus, as can be seen from (b) of FIG. 16, a Si nanostructure having a small height and a slightly inclined vertical pillar shape may have a gradually reduced refractive index upward. As a result, the Si nanostructure may have a low reflectance in a wide wavelength range and a wide incident angle.

Actually, referring to a Si nanostructure in (b) of FIG. 9, a larger number of fine pores and a rougher surface may be observed upward. In other words, the porosity of Si increases upward, and it may be seen that the Si nanostructure contains even micropores invisible to the naked eye.

Also, since a Si substrate is formed of only Si atoms, the Si substrate is chemically etched without influencing a reaction extent between atoms unlike a GaAs substrate formed of gallium (Ga) atoms and arsenic (As) atoms, and thus results shown in (a) of FIG. 16 may be obtained.

The following Formulae 1 and 2 are provided to describe a chemical reaction of the Ag particles 120 with the Si substrate 100 in detail and facilitate the understanding of FIGS. 15 and 16.

Reaction in Ag Particles

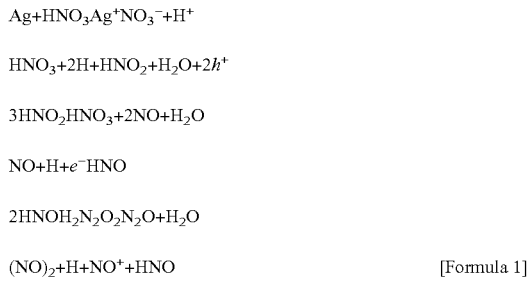

[Formula 1]

Reaction in Si Substrate 100

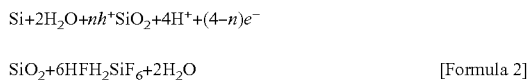

[Formula 2]

Embodiment 2

FIGS. 17 through 20 are cross-sectional views illustrating a method of fabricating a nanostructure for antireflection according to a second exemplary embodiment of the present invention.

Figure 17:
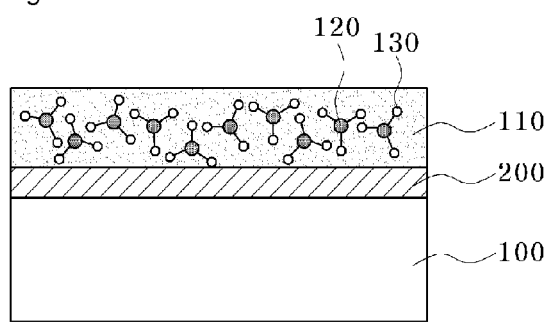
FIGS. 17 through 20 are cross-sectional views illustrating a method of fabricating a nanostructure for antireflection according to a second exemplary embodiment of the present invention.

Referring to FIG. 17, a buffer layer 200 may be deposited on a top surface of a prepared substrate 100 using, for example, a plasma-enhanced chemical vapor deposition (PECVD) process, a thermal CVD process, or a sputtering process, and a solution 110 containing a combination of metal ions 120 with organic or inorganic ions 130 may be uniformly coated on the buffer layer 200.

Here, the substrate 100 may be a semiconductor substrate, which is not limited to a Si substrate. Other than the semiconductor substrate, the substrate 100 may be any substrate that allows deposition of the buffer layer 200 on a top surface of the substrate 100 and enables metal particles (refer to 125 of FIG. 18) to accelerate a chemical reaction more in a portion containing the metal particles 125 than in the remaining portion. The buffer layer 200 may function as a mask during a chemical etching process and improve adhesion of the solution 110 containing a combination of metal ions 120 with organic or inorganic ions 130 and sintering reliability.

In general, when the solution 110 is changed into metal particles 125 using a sintering process, the period, size, and thickness of the metal particles 125 may be changed due to a difference in surface tension between the substrate 100 and the solution 110. Thus, when a material of the substrate 100 is changed according to purposes, the thickness of a metal and the kind, temperature, and time of an annealing apparatus should be changed. Accordingly, practically applying the sintering process may be difficult.

Conversely, when the buffer layer 200 is used, even if the material of the substrate 100 is changed, there may be no variation in surface tension between the buffer layer 200 and the solution 110, and the metal particles 125 may be reproducibly formed without changing the thickness and sintering temperature of a metal.

The buffer layer 200 may be deposited to a thickness of about 5 to 500 nm. First, the metal solution 110 may be changed into the subwavelength metal particles 125 due to surface tension after the sintering process. Second, the buffer layer 200 may be changed into a nanostructure buffer layer (refer to 200' of FIG. 19) by performing a chemical etching process using the metal particles (refer to 125 of FIG. 18) as an accelerator to expose a predetermined portion of a top surface of the substrate 100. The type and thickness of the buffer layer 200 may be selected to satisfy the above-described two points.

Also, the metal ions 120 may be any metal ions that may be bonded to organic or inorganic ions 130 and contained in the solution 110 and changed into the subwavelength metal particles 125 using a sintering process in consideration of surface tension with the buffer layer 200.

Here, the solution 110 may be coated to a thickness of about 1 to 500 nm by varying the type of a coating apparatus and controlling a coating condition of the apparatus and a dilution ratio.

Figure 18:
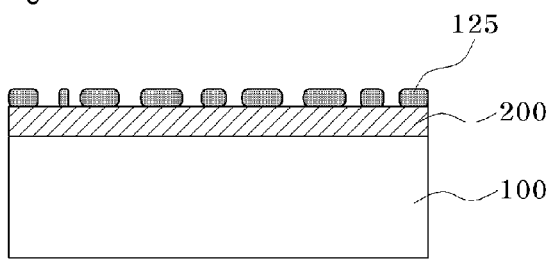

Since FIG. 18 is the same as described in the first embodiment, a detailed description thereof will be omitted.

Figure 19:
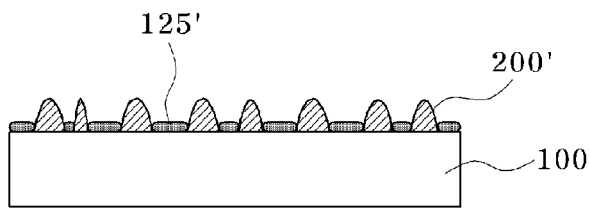

Referring to FIG. 19, the metal particles (refer to 125 of FIG. 18) may, for example, function as an accelerator of a chemical reaction in the buffer layer 200 containing the metal particles 125 so that only a portion of the buffer layer 200 that contains the metal particles 125 may be etched or the portion of the buffer layer 200 may be etched at a higher rate than the remaining portion so that a subwavelength nanostructure buffer layer 200' may be formed on a top surface of the substrate 100. In some cases, the remaining metal particles 125' may remain on the top surface of the substrate 100 after the chemical etching process and be removed using an additional chemical etching process as shown in FIG. 20, if required.

Figure 20:
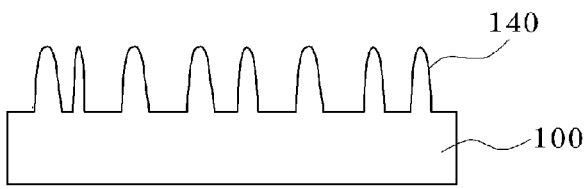

Referring to FIG. 20, the remaining metal particles 125' may, for example, function as an accelerator of a chemical reaction in the nanostructure buffer layer 200' containing the remaining metal particles 125' so that only a portion of the nanostructure buffer layer 200, which contains the metal particles 125', may be etched or the portion of the nanostructure buffer layer 200 may be etched at a higher rate than the remaining portion. Thus, a nanostructure 140 for antireflection may be formed on the top surface of the substrate 100 to have a period of about 10 to 1000 nm and a depth of about 50 to 600 nm, that is, a subwavelength period.

Meanwhile, the type of a solution used for the chemical etching process may be varied according to, for example, the kinds of the substrate 100, the metal particles 125, and the buffer layer 200. The height, inclination, and surface state of the nanostructure 140 for antireflection may be adjusted by controlling at least one of the concentrations, amounts, mixture ratio, and temperatures of chemical components and an etching time.

Furthermore, the chemical etching processes of FIGS. 19 and 20 may be performed using a one-time process, but the present invention is not limited thereto and the chemical etching processes of FIGS. 19 and 20 may be performed using two separate processes. A transparent electrode may be stacked on the top surface of the substrate 100 on which the nanostructure 140 for antireflection is integrated and applied to the fabrication of a photo device if required.

Embodiment 3

FIGS. 21 through 24 are cross-sectional views illustrating a method of fabricating a nanostructure for antireflection according to a third exemplary embodiment of the present invention.

Figure 21:
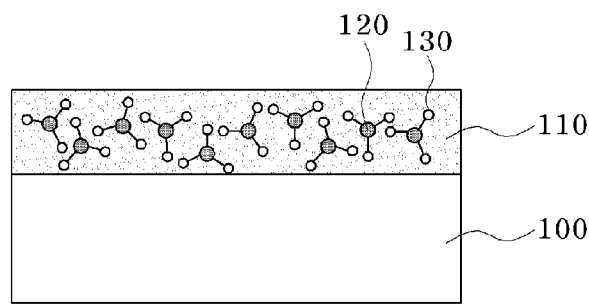
FIGS. 21 through 24 are cross-sectional views illustrating a method of fabricating a nanostructure for antireflection according to a third exemplary embodiment of the present invention.

Referring to FIG. 21, a solution 110 containing a combination of metal ions 120 with organic or inorganic ions 130 is uniformly coated on a top surface of a prepared semiconductor substrate 100. For example, the substrate 100 may be a semiconductor substrate, which is not limited thereto. Other than the semiconductor substrate, the substrate 100 may be any substrate that causes no reaction in a portion containing metal particles (or metal grains) (refer to 125 of FIG. 22) during a chemical reaction using the metal particles as a mask.

Figure 22:
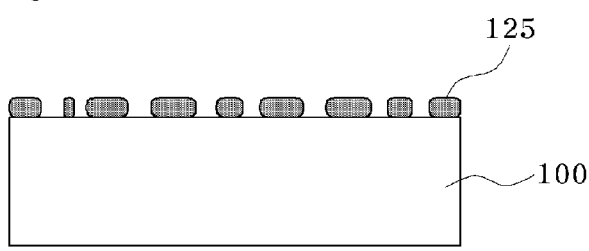

Since FIG. 22 is the same as described in the first and second embodiments, a detailed description thereof will be omitted.

Figure 23:
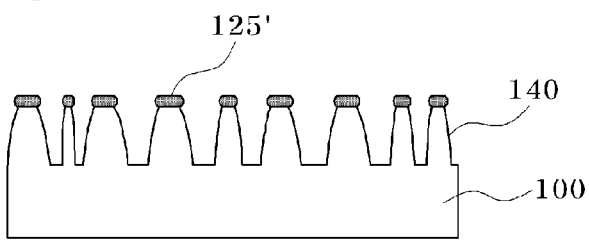

Referring to FIG. 23, for example, a chemical etching process may be performed on the top surface of the substrate 100 containing the metal particles (refer to 125 of FIG. 22) using the metal particles 125 as a mask. Thus, a nanostructure 140 for anti-reflection may be formed on a top surface of the substrate 100 to have a period of about 10 to 1000 nm and a depth of about 50 to 600 nm, that is, a subwavelength period.

Figure 24:
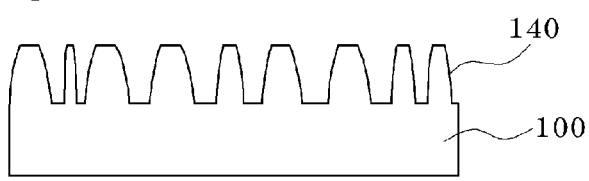

As shown in FIG. 23, in some cases, the remaining metal particles 125' may remain on the top surface of the substrate 100 after the chemical etching process and be removed using an additional chemical etching process as shown in FIG. 24, if required.

Embodiment 4

Figure 25:
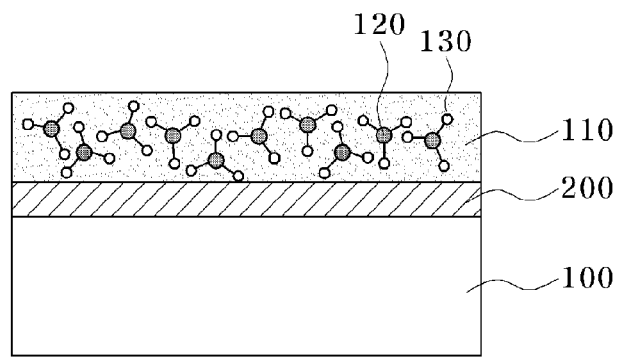
FIGS. 25 through 28 are cross-sectional views illustrating a method of fabricating a nanostructure for antireflection according to a fourth exemplary embodiment of the present invention.
Figure 26:
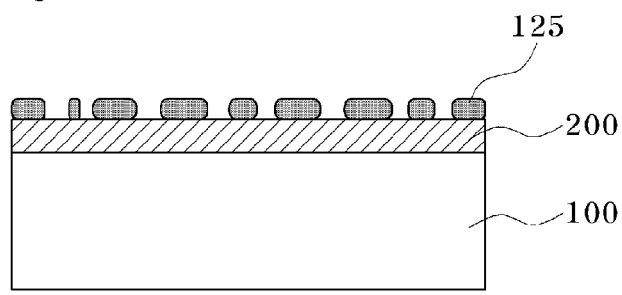
Figure 27:
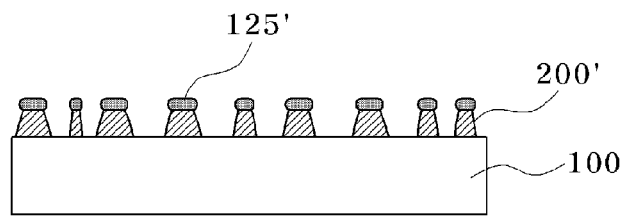
Figure 28:
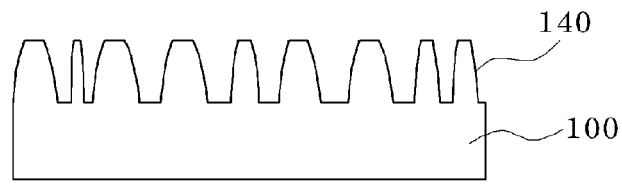

FIGS. 27 through 28 are cross-sectional views illustrating a method of fabricating a nanostructure for antireflection according to a fourth exemplary embodiment of the present invention. Since FIGS. 25 and 26 are the same as described in the second embodiment, a description thereof will be understood with reference to the second embodiment of FIGS. 17 and 18.

Referring to FIG. 27, for example, a chemical etching process may be performed on a top surface of a substrate 100 containing metal particles (refer to 125 of FIG. 26) and a buffer layer 200 using the metal particles 125 as a mask. Thus, a nanostructure buffer layer 200' may be formed to have a period of about 10 to 1000 nm, that is, a subwavelength period.

Referring to FIG. 28, the substrate 100 may be chemically etched using the remaining metal particles 125' and the nanostructure buffer layer 200' as a mask so that a nanostructure 140 for antireflection may be formed on the top surface of the substrate 100 to have a period of about 10 to 100 nm and a depth of about 50 to 600 nm, that is, a subwavelength period.

Furthermore, throughout FIGS. 27 and 28, the chemical etching process may be performed once, but not limited thereto, and may be separately performed in each drawing.

Embodiment 5

FIGS. 29 through 32 are cross-sectional views illustrating a method of fabricating a nanostructure for antireflection according to a fifth exemplary embodiment of the present invention, in which a transparent electrode 300 is further formed on a substrate 100.

Figure 29:
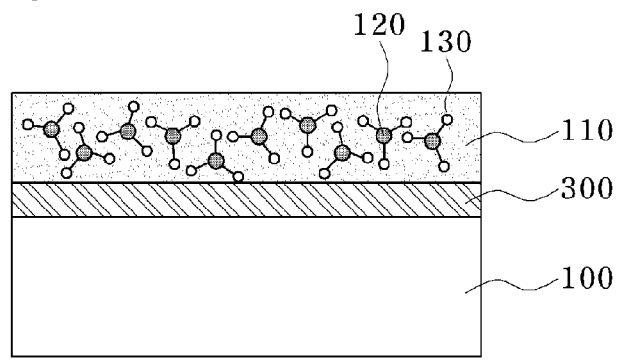
FIGS. 29 through 32 are cross-sectional views illustrating a method of fabricating a nanostructure for antireflection according to a fifth exemplary embodiment of the present invention.

Referring to FIG. 29, the transparent electrode 300 and a solution 110 containing a combination of metal ions 120 with organic or inorganic ions 130 are uniformly coated on a top surface of the prepared substrate 100.

Here, the substrate 100 may not be limited to, for example, a semiconductor substrate. Other than the semiconductor substrate, the substrate 100 may be any substrate on which the transparent electrode 300 is deposited and thus functions as a mask for etching the substrate during a chemical reaction.

The transparent electrode 300 may be deposited using, for example, an electronic beam (e-beam) evaporator, a thermal evaporator, or a sputtering evaporator.

The transparent electrode 300 may be formed of, for example, one material selected from the group consisting of indium tin oxide (ITO), tin oxide (TO), indium tin zinc oxide (ITZO), indium zinc oxide (IZO), zinc oxide (ZnO), and aluminum-doped zinc oxide (AZO).

Figure 30:
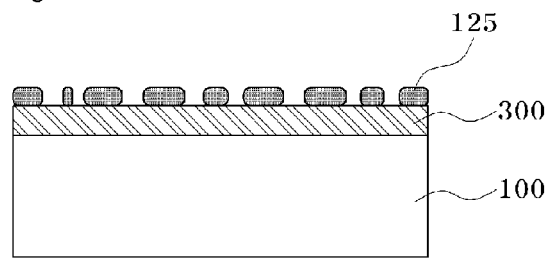

Since FIG. 30 is the same as described in the first through fourth embodiments, a detailed description thereof will be omitted.

Figure 31:
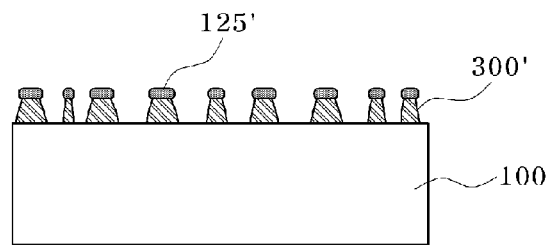

Referring to FIG. 31, a chemical etching process may be performed on the top surface of a substrate 100 containing metal particles 120 and a transparent electrode 300 using the metal particles 125 as a mask. Thus, a nanostructure transparent electrode 300' may be formed to have a period (about 10 to 1000 nm) of the transparent electrode 300, that is, a subwavelength period.

Figure 32:
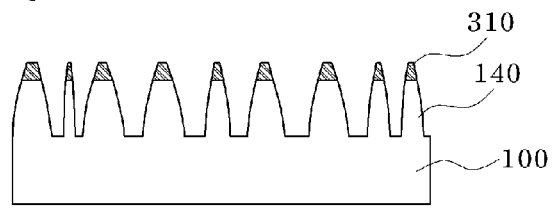

Referring to FIG. 32, the substrate 100 may be chemically etched using the remaining metal particles 125' and the nanostructure transparent electrode 300' as a mask. Thus, a nanostructure 140 for antireflection may be formed on the top surface of the substrate 100 to have a period of about 10 to 1000 nm and a depth of about 50 to 600 nm, that is, a sub-wavelength period.

In some cases, a nanostructure transparent electrode 310 may remain on the top surface of the nanostructure 140 for antireflection after the chemical etching process. The remaining nanostructure transparent electrode 310 may be removed using an additional chemical etching process if required. The transparent electrode 300 may be restacked on the top surface of the substrate 100 on which the nanostructure 140 for antireflection and the remaining nanostructure transparent electrode 310 are integrated and applied to the fabrication of a photo device.

Meanwhile, a buffer layer 200 having the same characteristics and conditions as in the second embodiment may be stacked in the same manner as in the second embodiment. A transparent electrode 300, the buffer layer 200, and a solution 100 containing a combination of metal ions 120 with organic or inorganic ions 130 may be sequentially formed. Thus, in the fifth embodiment, a chemical etching process for etching the buffer layer 200 and a chemical etching process for etching the nanostructure buffer layer 200' may be performed using the same method as in the second embodiment.

Embodiment 6

Figure 33:
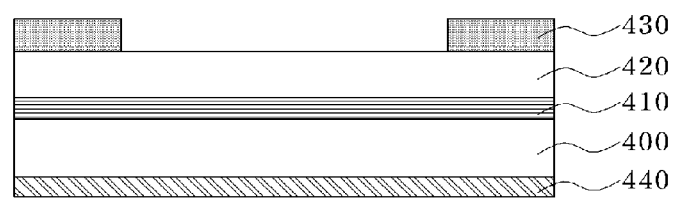
FIGS. 33 and 34 are cross-sectional views illustrating a method of fabricating a photo device integrated with a nanostructure for antireflection according to a sixth exemplary embodiment of the present invention.
Figure 34:
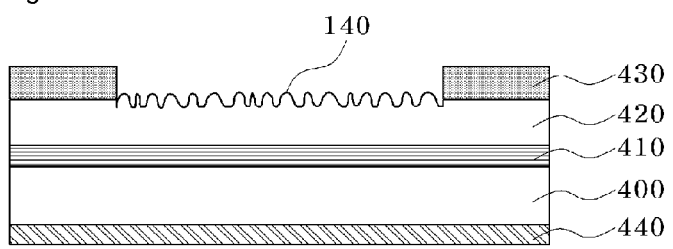

FIGS. 33 and 34 are cross-sectional views illustrating a method of fabricating a photo device integrated with a nanostructure for antireflection according to a sixth exemplary embodiment of the present invention.

To begin with, when a photo device to be fabricated is a light emitting device, referring to FIG. 33, for example, an n-type doped layer 400, an active layer 410, and a p-type doped layer 420 are sequentially stacked, a p-type upper electrode 430 may be stacked on a top surface of the p-type doped layer 420 except a light emitting device, and an n-type lower electrode 440 may be stacked on a bottom surface of the n-type doped layer 400. However, the present invention is not limited thereto.

Referring to FIG. 34, the nanostructure 140 for antireflection fabricated according to the first embodiment or the third embodiment may be integrated on a top surface of a light receiving unit of the n-type doped layer 420, thereby completing the method of fabricating the photo device integrated with the nanostructure for anti-reflection according to the first and third embodiments.

Meanwhile, when a photo device to be fabricated is a light receiving device, the photo device may have the same structure as the above-described light emitting device except for the positions of n-type and p-type doped layers 400 and 420, a p-type upper electrode 430, and an n-type lower electrode 440. For brevity, the same reference numerals will be used, and only names of components will be changed.

Specifically, referring to FIG. 33, for example, the fabrication of the photo device as the light receiving device may include sequentially stacking the p-type doped layer 400, the active layer 410, and the n-type doped layer 420, stacking the n-type upper electrode 430 on a top surface of the n-type doped layer 420 except a light receiving unit, and stacking the p-type lower electrode 440 on a bottom surface of the p-type doped layer 400, but the present invention is not limited thereto.

Referring to FIG. 34, a nanostructure 140 for antireflection fabricated according to the first or third embodiment may be integrated on a top surface of the light receiving unit of the n-type doped layer 420, thereby completing the fabrication of the photo device integrated with the nanostructure 140 for antireflection according to the first or third embodiment.

In the method of fabricating the photo device integrated with the nanostructure 140 for antireflection according to the sixth embodiment, since a method of forming the nanostructure 140 for antireflection is the same as described in the first embodiment or the third embodiment, a detailed description thereof will be omitted.

Also, a buffer layer may be formed in the same manner as described in the second embodiment or the fourth embodiment to fabricate the nanostructure 140 for anti-reflection. Since the fabrication of the nanostructure 140 using the buffer layer is the same as described in the second and fourth embodiments, a detailed description thereof will be omitted.

Embodiment 7

Figure 35:
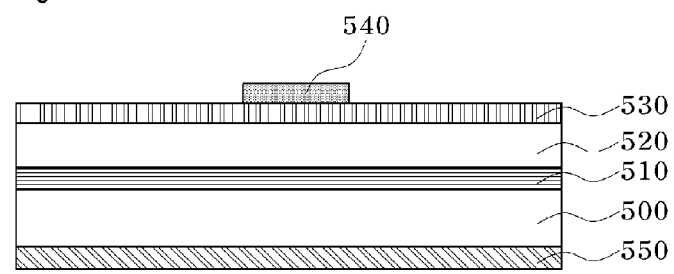
FIGS. 35 and 36 are cross-sectional views illustrating a method of fabricating a photo device integrated with a nanostructure for antireflection according to a seventh exemplary embodiment of the present invention.
Figure 36:
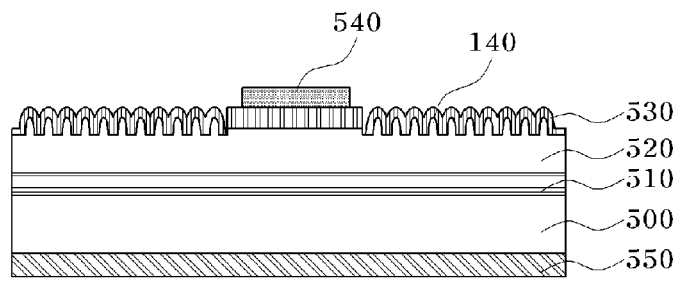

FIGS. 35 and 36 are cross-sectional views illustrating a method of fabricating a photo device integrated with a nanostructure for antireflection according to a seventh exemplary embodiment of the present invention.

To begin with, when a photo device to be fabricated is a light emitting device, referring to FIG. 35, for example, an n-type doped layer 500, an active layer 510, and a p-type doped layer 520 may be sequentially stacked, a transparent electrode 530 and a contact pad 540 may be sequentially stacked on the p-type doped layer 520, and an n-type lower electrode 550 may be stacked on a bottom surface of the n-type doped layer 500, but the present invention is not limited thereto.

Referring to FIG. 36, before the transparent electrode 530 is stacked, the nanostructure 140 for antireflection fabricated according to the first or third embodiment may be integrated on a top surface of a light emitting unit of the p-type doped layer 520, thereby completing the method of fabricating the photo device integrated with the nanostructure 140 for antireflection according to the seventh embodiment.

In this case, since the method of fabricating the nanostructure 140 for antireflection is the same as in the first or third embodiment, a detailed description thereof will be omitted.

Meanwhile, after the transparent electrode 530 is stacked on a top surface of the p-type doped layer 520 including the nanostructure 140 for antireflection, the contact pad 540 may be stacked on a top surface of the transparent electrode 530 except the light emitting unit. In this case, since the transparent electrode 530 is deposited on the nanostructure 140 for antireflection, the transparent electrode 530 may be formed in the same shape as the nanostructure 140 for anti-reflection.

In another case, after the transparent electrode 530 is initially stacked, a nanostructure 140 for antireflection and a nanostructure transparent electrode 310, which are fabricated according to the fifth embodiment, may be integrated on a top surface of the light emitting unit of the p-type doped layer 520, and a contact pad 540 may be stacked on the top surface of the transparent electrode 530 except a light emitting device, thereby completing the method of fabricating the photo device integrated with the nanostructure 140 for antireflection according to the seventh embodiment.

Meanwhile, when a photo device to be fabricated is a light receiving device, the light receiving device may have the same structure as the foregoing light emitting device except that the positions of n-type and p-type doped layers 500 and 520 may be changed and an n-type lower electrode 550 is replaced by a p-type lower electrode. Thus, for brevity, the same reference numerals will be used, and only names of components will be changed.

That is, referring to FIG. 35, for example, the fabrication of the photo device may include sequentially stacking a p-type doped layer 500, an active layer 510, and an n-type doped layer 520, sequentially stacking a transparent electrode 530 and a contact pad 540 on the n-type doped layer 520, and stacking a p-type lower electrode 550 on a bottom surface of the p-type doped layer 500, but the present invention is not limited thereto.

Referring to FIG. 36, before the transparent electrode 530 is stacked, a nanostructure 140 for antireflection fabricated according to the first or third embodiment may be integrated on a top surface of a light receiving unit of the n-type doped layer 520, thereby completing the method of fabricating the photo device integrated with the nanostructure for antireflection according to the seventh embodiment.

In this case, since the method of fabricating the nanostructure 140 for antireflection is the same as described in the first or third embodiment, a detailed description thereof will be omitted.

Meanwhile, after the transparent electrode 530 is stacked on the entire surface of the n-type doped layer 520 including the nanostructure 140 for antireflection, the contact pad 540 may be stacked on a top surface of the transparent electrode 530 except the light receiving unit. In this case, since the transparent electrode 530 is deposited on the nanostructure 140 for antireflection, the transparent electrode 530 may be formed in the same shape as the nanostructure 140 for anti-reflection.

In another case, after the transparent electrode 530 is initially stacked, a nanostructure 140 for antireflection and a nanostructure transparent electrode 310, which are fabricated according to the fifth embodiment, may be integrated on a top surface of the light receiving unit of the p-type doped layer 520, and the contact pad 540 may be stacked on the top surface of the transparent electrode 530 except the light receiving device, thereby completing the method of fabricating the photo device integrated with the nanostructure 140 for antireflection according to the seventh embodiment.

Embodiment 8

Figure 37:
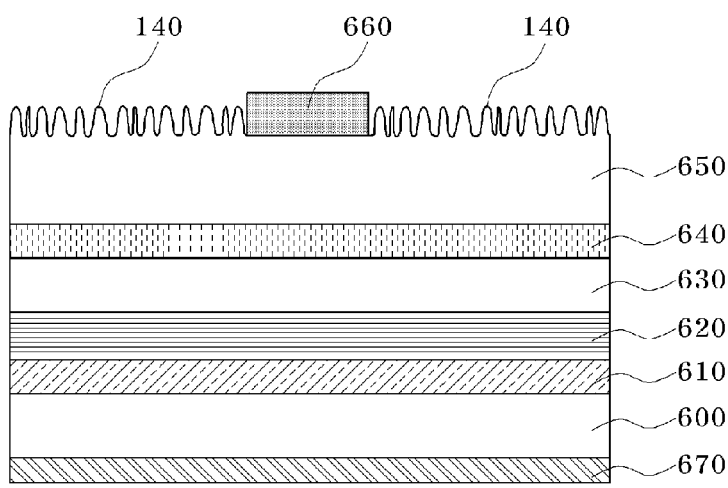
FIG. 37 is a cross-sectional view illustrating a method of fabricating a photo device integrated with a nanostructure for antireflection according to an eighth exemplary embodiment of the present invention.

FIG. 37 is a cross-sectional view illustrating a photo device integrated with a nanostructure for antireflection according to an eighth exemplary embodiment of the present invention.

Referring to FIG. 37, the photo device may be a triple junction solar cell, which includes a germanium (Ge) bottom cell layer 600 having a bandgap of about 0.65 eV, an $In_{0.08}Ga_{0.92}As$ middle cell layer 630 disposed on the bottom cell layer 600 and having a bandgap of about 1.4 eV, and an $In_{0.56}Ga_{0.44}P$ top cell layer 650 disposed on the middle cell layer 630 and having a bandgap of about 1.9 eV.

Also, the respective cell layers 600, 630, and 650 may be electrically connected to each other by first and second tunnel junction layers 610 and 640. A p-type upper electrode 660 is formed on a top surface of one side of the top cell layer 650, and an n-type lower electrode 670 is formed on a bottom surface of the bottom cell layer 600.

In particular, the nanostructure 140 for antireflection fabricated according to the first or third embodiment may be integrated on the top surface of the top cell layer 650 except the p-type upper electrode 660, thereby completing the method of fabricating the triple junction solar cell integrated with the nanostructure 140 for anti-reflection according to the eighth embodiment.

In this case, since the method of fabricating the nanostructure 140 for antireflection is the same as described in the first or third embodiment, a detailed description thereof will be omitted.

An InGaAs buffer layer 620 may be further disposed between the first tunnel junction layer 610 and the middle cell layer 630.

That is, in view of absorption of a sunlight spectrum, the top cell layer 650 absorbs light in a wavelength band of about 650 nm, the middle cell layer 630 absorbs light in a wavelength band of about 900 nm, and the bottom cell layer 600 absorbs light in a wavelength band of about 1900 nm, so that the solar cell can be structured to absorb light over a wide bandwidth range.

In this case, by applying the method of fabricating the nanostructure 140 for anti-reflection to the surface of the top cell layer 650, reflection of incident light may be minimized, thereby elevating the efficiency of the solar cell.

Embodiment 9

Figure 38:
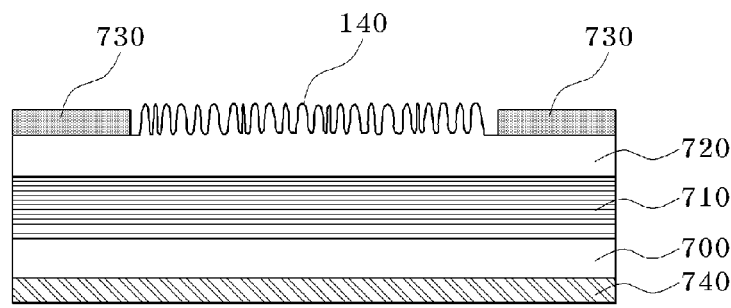
FIG. 38 is a cross-sectional view illustrating a method of fabricating a photo device integrated with a nanostructure for antireflection according to an eighth exemplary embodiment of the present invention.

FIG. 38 is a cross-sectional view illustrating a photo device integrated with a nanostructure for antireflection according to an eighth exemplary embodiment of the present invention.

Referring to FIG. 38, a photo device may be typically a photodetector. For example, the formation of the photo device may include sequentially stacking an n-type doped layer 700, a light absorption layer 710, and a p-type doped layer 720, stacking a p-type upper electrode 730 on a top surface of the p-type doped layer 720 except a light absorption unit, and stacking an n-type lower electrode 540 on a bottom surface of the n-type doped layer 700, but the present invention is not limited thereto.

In particular, the nanostructure 140 for antireflection fabricated according to the first or third embodiment may be integrated on the top surface of the light absorption unit of the p-type doped layer 720, thereby completing the method of fabricating a photo device integrated with the nanostructure 140 for antireflection according to the ninth embodiment.

In this case, since the method of fabricating the nanostructure 140 for antireflection is the same as in the first or third embodiment, a detailed description thereof will be omitted.

Here, the method of fabricating the nanostructure 140 for antireflection may be applied to the surface of the p-type doped layer 720, thereby minimizing reflection of incident light and increasing the efficiency of the photodetector.

Embodiment 10

Figure 39:
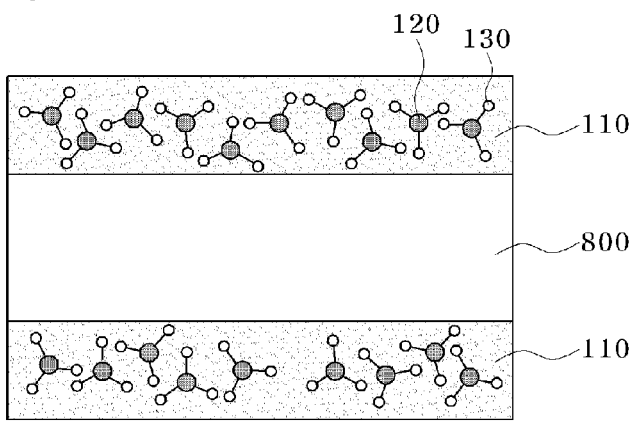
FIGS. 39 through 41 are cross-sectional views illustrating a method of fabricating a photo device integrated with a nanostructure for antireflection according to tenth and eleventh exemplary embodiments of the present invention.
Figure 40:
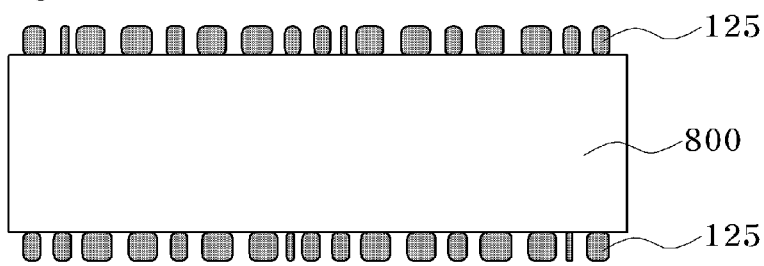
Figure 41:
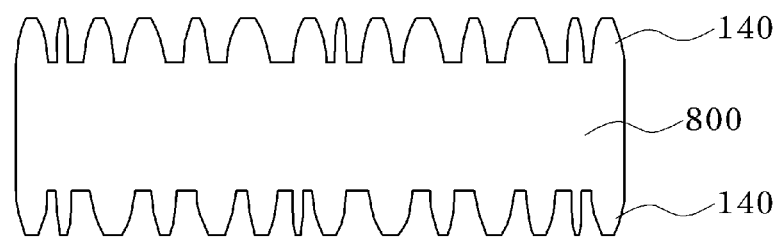

FIGS. 39 through 41 are cross-sectional views illustrating a photo device integrated with a nanostructure for antireflection according to a tenth exemplary embodiment of the present invention.

Referring to FIG. 39, the photo device may be a typical transparent glass 800 having a refractive index of about 1.5 and a transmission rate of about 95% in a specific wavelength band. However, the photo device may require a transmission rate of about 99% or more in a wide band in the fields of some applications, such as solar cells.

To form the transparent glass 800 having a transmission rate of about 99% or higher, a solution 110 containing a combination of metal ions 120 with organic or inorganic ions 130 is uniformly coated on top and bottom surfaces of the transparent glass 800.

Referring to FIG. 40, nanoscale metal particles 125 are sintered on the top and bottom surfaces of the transparent glass 800 using an annealing process.

Referring to FIG. 41, a subwavelength nanostructure 140 for antireflection may be formed on the top and bottom surfaces of the transparent glass 800 using a one-time chemical etching process, thereby fabricating the transparent glass 800 integrated with the nanostructure 140 for antireflection formed on the top and bottom surfaces of the transparent glass 800. Thus, the transparent glass 800 may have a higher transmission rate in the wide wavelength band than a transparent glass having one surface on which the nanostructure 140 for antireflection is formed.

Embodiment 11

The eleventh embodiment is performed using the same method as the foregoing tenth embodiment. A subwavelength nanostructure 140 for antireflection may be formed on top and bottom surfaces of a substrate (refer to 800 of FIG. 13) formed of Si, GaAs, gallium nitride (GaN), or sapphire, thereby reducing the reflectance of Si and increasing a transmission rate in the wide wavelength band.

While the invention has been shown and described with reference to m certain exemplary embodiments thereof, it will be understood by those skilled in the art that various changes in form and details may be made therein without departing from the spirit and scope of the invention as defined by the appended claims.

The invention claimed is:

1. A method of fabricating a subwavelength nanostructure for antireflection, comprising: coating a solution containing a combination of metal ions with organic or inorganic ions on a semiconductor substrate; sintering the coated solution using an annealing process to grow nanoscale metal particles; and chemically etching the substrate using the grown nanoscale metal particles as a mask or accelerator to form the subwavelength nanostructure on the substrate; wherein the metal ions are bonded to other metal ions via the annealing process to grow subwavelength metal particles having a controllable size, and wherein when the grown nanoscale metal particles are used as accelerator, a portion of the substrate that contains the grown nanoscale metal particles is only etched or etched at a higher rate than a remaining portion of the substrate.

2. The method according to claim 1, wherein the metal ions are any metal ions capable of being bonded to the organic or inorganic ions in a solution state and being sintered such that the metal ions are separated from the organic or inorganic ions and bonded to other metal ions via the annealing process.

3. The method according to claim 1, which the annealing of the coated solution is performed in a nitrogen ($N_2$) atmosphere to prevent oxidation of the metal ions and improve reproducibility and reliability with respect to the size and thickness of the metal particles.

4. The method according to claim 1, wherein when the metal ions are bonded to the organic ions, the combination is diluted with one alcohol-based solution selected from the group consisting of methanol, ethanol, and isopropyl alcohol to adjust the concentration of a metal, and when the metal ions are bonded to inorganic ions, the combination is diluted with water to adjust the concentration of the metal so that the solution is coated to a thickness of about 1 to 500 nm.

5. The method according to claim 1, wherein the size of the metal particles is controlled by adjusting the time and temperature of the annealing process.

6. The method according to claim 1, wherein the substrate is a silicon (Si) substrate, and the silicon substrate is chemically etched while varying a mixture ratio of water ($H_2O$), nitric acid ($HNO_3$), and hydrogen fluoride (HF) irrespective of a crystallization direction of the substrate.

7. The method according to claim 6, wherein the chemical etching of the silicon substrate is performed by controlling a mixture ratio of $H_2O$, $HNO_3$, and HF to 20:1:4 or 20:4:1 or includes performing a primary etching process using $H_2O$, $HNO_3$, and HF mixed at a mixture ratio of 20:1:4 and performing a secondary etching process using $H_2O$, $HNO_3$, and HF mixed at a mixture ratio of 20:4:1.

8. A method of fabricating a subwavelength nanostructure for antireflection, comprising: depositing a transparent electrode or buffer layer on a semiconductor substrate; coating a solution containing a combination of metal ions with organic or inorganic ions on the transparent electrode or the buffer layer; sintering the coated solution using an annealing process to grow nanoscale metal particles; performing a chemical etching process using the grown nanoscale metal particles as a mask or accelerator such that the transparent electrode or the buffer layer becomes a nanostructure transparent electrode or buffer layer; and chemically etching the substrate using the nanostructure transparent electrode or buffer layer and the grown nanoscale metal particles to form a the subwavelength nanostructure on the substrate, wherein the metal ions are bonded to other metal ions via the annealing process to grow subwavelength metal particles having a controllable size, and wherein when the grown nanoscale metal particles are used as accelerator, a portion of the substrate that contains the grown nanoscale metal particles is only etched or etched at a higher rate than a remaining portion of the substrate.

9. The method according to claim 8, wherein the metal ions are any metal ions capable of being bonded to the organic or inorganic ions in a solution state and being sintered such that the metal ions are separated from the organic or inorganic ions and bonded to other metal ions via the annealing process.

10. The method according to claim 8, which the annealing of the coated solution is performed in a nitrogen ($N_2$) atmosphere to prevent oxidation of the metal ions and improve reproducibility and reliability with respect to the size and thickness of the metal particles.

11. The method according to claim 8, wherein when the metal ions are bonded to the organic ions, the combination is diluted with one alcohol-based solution selected from the group consisting of methanol, ethanol, and isopropyl alcohol to adjust the concentration of a metal, and when the metal ions are bonded to inorganic ions, the combination is diluted with water to adjust the concentration of the metal so that the solution is coated to a thickness of about 1 to 500 nm.

12. The method according to claim 8, wherein the size of the metal particles is controlled by adjusting the time and temperature of the annealing process.

13. The method according to claim 8, wherein the substrate is a silicon (Si) substrate, and the silicon substrate is chemically etched while varying a mixture ratio of water ($H_2O$), nitric acid ($HNO_3$), and hydrogen fluoride (HF) irrespective of a crystallization direction of the substrate.

14. The method according to claim 13, wherein the chemical etching of the silicon substrate is performed by controlling a mixture ratio of $H_2O$, $HNO_3$, and HF to 20:1:4 or 20:4:1 or includes performing a primary etching process using $H_2O$, $HNO_3$, and HF mixed at a mixture ratio of 20:1:4 and performing a secondary etching process using $H_2O$, $HNO_3$, and HF mixed at a mixture ratio of 20:4:1.

15. A method of fabricating a photo device integrated with a subwavelength nanostructure for antireflection, when the photo device is a light emitting device, the method comprising: (a) sequentially stacking an n-type doped layer, an active layer, and a p-type doped layer and coating a solution containing a combination of metal ions and organic or inorganic ions on a top surface of a light emitting unit of the p-type doped layer; (b) sintering the coated solution using an annealing process to grow nanoscale metal particles; and (c) chemically etching the top surface of the light emitting unit of the p-type doped layer using the grown nanoscale metal particles as a mask or accelerator to form the subwavelength nanostructure for antireflection on the top surface of the light emitting unit of the p-type doped layer, the subwavelength nanostructure being configured to taper upward, and when the photo device is a light receiving device, the method comprising: (a') sequentially stacking a p-type doped layer, an active layer, and an n-type doped layer and coating a solution containing a combination of metal ions and organic or inorganic ions on a top surface of a light receiving unit of the n-type doped layer; (b') sintering the coating solution using an annealing process to grow nanoscale metal particles; and (c') chemically etching the top surface of the light receiving unit of the n-type doped layer using the grown nanoscale metal particles as a mask or accelerator to form the subwavelength nanostructure for antireflection on the top surface of the light receiving unit of the n-type doped layer, the subwavelength nanostructure being configured to taper upward, wherein the metal ions are bonded to other metal ions via the annealing process to grow subwavelength metal particles having a controllable size, and wherein when the grown nanoscale metal particles are used as accelerator, a portion of the substrate that contains the grown nanoscale metal particles is only etched or etched at a higher rate than a remaining portion of the substrate.

16. The method according to claim 15, further comprising: when the photo device is the light emitting device, stacking a p-type upper electrode on a top surface of the p-type doped layer except the light emitting unit and stacking an n-type lower electrode on a bottom surface of the n-type doped layer before coating the solution in step (a) or after step (c), and when the photo device is the light receiving device, stacking an n-type upper electrode on a top surface of the n-type doped layer except the light receiving unit and stacking a p-type lower electrode on a bottom surface of the p-type doped layer before coating the solution in step (a') or after step (c').

17. The method according to claim 15, further comprising: when the photo device is the light emitting device, stacking a transparent electrode on the entire surface of the p-type doped layer including the nanostructure for antireflection, stacking a contact pad on a top surface of the transparent electrode except the light emitting unit, and stacking an n-type lower electrode on a bottom surface of the n-type doped layer after step (c), and when the photo device is the light receiving device, stacking a transparent electrode on the entire surface of the n-type doped layer including the nanostructure for antireflection, stacking a contact pad on a top surface of the transparent electrode except the light receiving unit, and stacking a p-type lower electrode on a bottom surface of the p-type doped layer after step (c').

* * * * *